United States Patent [19]

Rakib

[11] Patent Number: 5,586,068
[45] Date of Patent: Dec. 17, 1996

[54] ADAPTIVE ELECTRONIC FILTER

[75] Inventor: Shlomo Rakib, San Diego, Calif.

[73] Assignee: Terayon Corporation, Santa Clara, Calif.

[21] Appl. No.: 164,016

[22] Filed: Dec. 8, 1993

[51] Int. Cl.$^6$ .................................................. G06F 15/31
[52] U.S. Cl. .............................. 364/724.16; 364/724.19
[58] Field of Search ........................... 364/724.19, 724.16

[56] References Cited

U.S. PATENT DOCUMENTS

| | | | |
|---|---|---|---|
| 3,706,076 | 12/1972 | Schuster | 340/172.5 |
| 4,573,136 | 2/1986 | Rossiter | 364/750.5 |
| 4,641,259 | 2/1987 | Shan et al. | 364/724 |
| 4,667,298 | 5/1987 | Wedel, Jr. | 364/602 |
| 4,691,293 | 9/1987 | Conboy | 364/724 |
| 4,755,961 | 7/1988 | Kuriki et al. | 364/724 |
| 4,771,395 | 9/1988 | Watanabe et al. | 364/724.16 |
| 4,791,597 | 12/1988 | Miron et al. | 364/723.03 |
| 4,821,223 | 4/1989 | David | 364/724.05 |
| 4,843,581 | 6/1989 | Cupo et al. | 364/724.01 |
| 4,853,969 | 8/1989 | Weideman | 382/54 |
| 4,866,648 | 9/1989 | Usui | 364/724.01 |
| 5,034,907 | 7/1991 | Johnson et al. | 364/724.16 |
| 5,040,137 | 8/1991 | Sherrill | 364/724.16 |
| 5,047,972 | 9/1991 | Wada | 364/724.16 |
| 5,050,118 | 9/1991 | Inoue et al. | 364/724.01 |
| 5,053,983 | 10/1991 | Hyatt | 364/724.03 |
| 5,060,180 | 10/1991 | Kingston et al. | 364/724.03 |
| 5,103,416 | 4/1992 | Cavallotti et al. | 364/724.16 |
| 5,117,385 | 5/1992 | Gee | 364/724.16 |
| 5,379,242 | 1/1995 | Rose et al. | 364/724.16 |

FOREIGN PATENT DOCUMENTS 0564751 10/1993 European Pat. Off. .

OTHER PUBLICATIONS

Golla et al, "30–M Samples/s Programmable Filter Processor," IEEE Journal of Solid–State Circuit, vol. 25, No. 6, Dec. 1990, pp. 1502–1509.

*Primary Examiner*—Tan V. Mai
*Attorney, Agent, or Firm*—Kenneth M. Kaslow; Bobby K. Truong; John T. McNelis

[57] ABSTRACT

A programmable and adaptive electronic filter for filtering digital signals. The filter uses a table which contains the outputs corresponding to all possible inputs, so that the filter may be constructed of memory, adders and multiplexers, and does not require multipliers. The input sample is used as an address to determine the location in the memory which contains the output corresponding to that input. The table of outputs is placed in a particular order such that the change between the inputs corresponding to each two adjacent locations is a single digit, thus allowing the table to be easily calculated, since the difference between the outputs in those two locations is two times the weighting coefficient for the digit in the input which is changed. Adaptive filtering is accomplished by using a second filter which has as its input the difference between the actual output of the filter and the desired output, and as its output changes to the weighting coefficients of the filter.

11 Claims, 21 Drawing Sheets

| Row # | INPUT Vector $g_4 g_3 g_2 g_1 g_0$ | Table Cell Content | Increments | SGN | NDX | $b_4 b_3 b_2 b_1 b_0$ |
|---|---|---|---|---|---|---|
| 0 | 00000 | $-h_5 -h_4 -h_3 -h_2 -h_1 -h_0$ | | | | 00000 |
| 1 | 00001 | $-h_5 -h_4 -h_3 -h_2 -h_1 +h_0$ | $+h_0 *2$ | + | 0 | 00001 |
| 2 | 00011 | $-h_5 -h_4 -h_3 -h_2 +h_1 +h_0$ | $+h_1 *2$ | + | 1 | 00010 |
| 3 | 00010 | $-h_5 -h_4 -h_3 -h_2 +h_1 -h_0$ | $-h_0 *2$ | − | 0 | 00011 |
| 4 | 00110 | $-h_5 -h_4 -h_3 +h_2 +h_1 -h_0$ | $+h_2 *2$ | + | 2 | 00100 |
| 5 | 00111 | $-h_5 -h_4 -h_3 +h_2 +h_1 +h_0$ | $+h_0 *2$ | + | 0 | 00101 |
| 6 | 00101 | $-h_5 -h_4 -h_3 +h_2 -h_1 +h_0$ | $-h_1 *2$ | − | 1 | 00110 |
| 7 | 00100 | $-h_5 -h_4 -h_3 +h_2 -h_1 -h_0$ | $-h_0 *2$ | − | 0 | 00111 |
| 8 | 01100 | $-h_5 -h_4 +h_3 +h_2 -h_1 -h_0$ | $+h_3 *2$ | + | 3 | 01000 |
| 9 | 01101 | $-h_5 -h_4 +h_3 +h_2 -h_1 +h_0$ | $+h_0 *2$ | + | 0 | 01001 |
| 10 | 01111 | $-h_5 -h_4 +h_3 +h_2 +h_1 +h_0$ | $+h_1 *2$ | + | 1 | 01010 |
| 11 | 01110 | $-h_5 -h_4 +h_3 +h_2 +h_1 -h_0$ | $-h_0 *2$ | − | 0 | 01011 |
| 12 | 01010 | $-h_5 -h_4 +h_3 -h_2 +h_1 -h_0$ | $-h_2 *2$ | − | 2 | 01100 |
| 13 | 01011 | $-h_5 -h_4 +h_3 -h_2 +h_1 +h_0$ | $+h_0 *2$ | + | 0 | 01101 |
| 14 | 01001 | $-h_5 -h_4 +h_3 -h_2 -h_1 +h_0$ | $-h_1 *2$ | − | 1 | 01110 |
| 15 | 01000 | $-h_5 -h_4 +h_3 -h_2 -h_1 -h_0$ | $-h_0 *2$ | − | 0 | 01111 |

*FIG. 4A*

| Row # | INPUT Vector $g_4 g_3 g_2 g_1 g_0$ | Table Cell Content | Increments | SGN | NDX | $b_4 b_3 b_2 b_1 b_0$ |
|---|---|---|---|---|---|---|
| 16 | 11000 | $-h_5+h_4+h_3-h_2-h_1-h_0$ | $+h_4*2$ | + | 4 | 10000 |
| 17 | 11001 | $-h_5+h_4+h_3-h_2-h_1+h_0$ | $+h_0*2$ | + | 0 | 10001 |
| 18 | 11011 | $-h_5+h_4+h_3-h_2+h_1+h_0$ | $+h_1*2$ | + | 1 | 10010 |
| 19 | 11010 | $-h_5+h_4+h_3-h_2+h_1-h_0$ | $-h_0*2$ | − | 0 | 10011 |
| 20 | 11110 | $-h_5+h_4+h_3+h_2+h_1-h_0$ | $+h_2*2$ | + | 2 | 10100 |
| 21 | 11111 | $-h_5+h_4+h_3+h_2+h_1+h_0$ | $+h_0*2$ | + | 0 | 10101 |
| 22 | 11101 | $-h_5+h_4+h_3+h_2-h_1+h_0$ | $-h_1*2$ | − | 1 | 10110 |
| 23 | 11100 | $-h_5+h_4+h_3+h_2-h_1-h_0$ | $-h_0*2$ | − | 0 | 10111 |
| 24 | 10100 | $-h_5+h_4-h_3+h_2-h_1-h_0$ | $-h_3*2$ | − | 3 | 11000 |
| 25 | 10101 | $-h_5+h_4-h_3+h_2-h_1+h_0$ | $+h_0*2$ | + | 0 | 11001 |
| 26 | 10111 | $-h_5+h_4-h_3+h_2+h_1+h_0$ | $+h_1*2$ | + | 1 | 11010 |
| 27 | 10110 | $-h_5+h_4-h_3+h_2+h_1-h_0$ | $-h_0*2$ | − | 0 | 11011 |
| 28 | 10010 | $-h_5+h_4-h_3-h_2+h_1-h_0$ | $-h_2*2$ | − | 2 | 11100 |
| 29 | 10011 | $-h_5+h_4-h_3-h_2+h_1+h_0$ | $+h_0*2$ | + | 0 | 11101 |
| 30 | 10001 | $-h_5+h_4-h_3-h_2-h_1+h_0$ | $-h_1*2$ | − | 1 | 11110 |
| 31 | 10000 | $-h_5+h_4-h_3-h_2-h_1-h_0$ | $-h_0*2$ | − | 0 | 11111 |

FIG. 4B

ADAPTIVE ELECTRONIC FILTER

BACKGROUND OF THE INVENTION

1. Field of the Invention

This invention relates generally to electronic filters, and relates more particularly to programmable finite impulse response (FIR) filters.

2. Description of the Relevant Art

A finite impulse response (FIR) filter is a type of electronic filter with a broad range of applications. Such filters are widely used in both digital signal procession and real-time digital video processing, and may be used in, for example, the public switched telephone networks, wide area networks, or local area networks, and may be used with either copper media or optical fiber.

Where electronic data is transmitted over copper unshielded twisted pair (UTP) cables, either high speed or low speed transmission may be used. Low speed data transmission over UTP cables is known as E1-T1 transmission. There are several standards for high speed data transmission over UTP cables, including the 802.X family of standards, the FDDI standard, and the SONET standard, which is also known as the ATM or SDH standard.

In such conventional high and low speed transmission over UTP cables, adaptive filtering is used to continuously analyze the individual data elements being transmitted and to continuously update the FIR filter. Such filtering uses adaptation algorithms to prevent errors in the data being transmitted, for example, from an echo signal from the transmitter. Such echo signals may be significantly stronger than the original signal, making detection of the received signal without error impossible.

The operation of such an adaptive filter and the associated adaptation algorithm involves two separate functions. The first is the filtering process designed to produce a specific output in response to a specific sequence of input data. The second is an adaptive process by which the parameters of the filter may be changed based upon an analysis of the inputs and outputs of the filter.

One type of FIR filter suitable for use in adaptive filtering is a transversal filter, or tapped delay line filter. As shown in FIG. 1, the output of such a filter is a weighted combination of voltages taken from uniformly spaced taps. The filter 10 contains a plurality of unit delay elements 12, multipliers 14, and adders 16. The filter is considered to be of the Mth order, where M−1 is the number of delay elements.

Each delay element introduces a delay of time t. When a delay element operates on an input $U_n$, which is the filter input at an initial time $t_0$ plus n*t, the resulting output is $U_{n-1}$, i.e. the input one delay period before. Thus, $U_{n-k}$ is the filter input at a time $t_0$ plus (n−k)*t, which is also the output of the kth delay element at time $t_0$ plus n*t. Each multiplier multiplies the tap input to which it is connected by a filter coefficient referred to as the tap weight $W_k$ so that the multiplier connected to the kth tap input $U_{n-k}$ produces an output $U_{n-k}*W_k$.

The adders sum the outputs of the multipliers to produce the filter output. This overall output $Y_n$ is given by the formula $$Y_n = \sum_{k=0}^{M-1} U_{n-k} * W_k \quad (1)$$

This weighted sample allows the filter to reduce noise in the input signal.

Various attempts have been made to simplify this type of filter. For example, some transversal filters have been based upon powers of two so that the signal can just be shifted one bit at a time instead of using multipliers.

SUMMARY OF THE INVENTION

In accordance with the illustrated preferred embodiment, the present invention provides for the use of a table for storing all of the possible output values, rather than the multipliers and adders of the prior art, with the input sample being used as an address for a location which holds the output corresponding to that input. The table is easily calculated using the fact that it is possible to place all of the possible binary strings of a given length in an order such that the change between any two consecutive strings is a single digit. Since each digit is to be weighted by a particular tap weight, the output for each input is calculated by taking the prior output and adding or subtracting two times the tap weight for the digit which is changed, depending upon whether the digit changes from a 1 to a 0 or vice versa. Simple decoders also use the order of the table to determine which digit is changing, and which way it changes. By also using the natural symmetry of binary numbers, i.e. that changing each 1 to a 0 and each 0 to a 1 another number is obtained, the table may be made only half as large as would normally be expected.

The simplicity of this system allows for many variations. For example, an input string may be split into high order (i.e. those that are first in time) and low order bits, each of which is used to access a different table, thus keeping the total memory necessary smaller than would be required for one continuous string of bits. The outputs are then added to obtain the output of the filter. Where each element of the input sample is comprised of more than one bit, the input samples may be divided into several strings of one bit elements, and these strings used to access several tables concurrently, or one table consecutively, with the outputs again added (and in this case weighted) to obtain the overall output of the filter.

Finally, because of the ease of creating the table of outputs, this approach is particularly well suited to adaptive filtering, in which the outputs are to be adjusted over time to approach a desired output. The table, which contains the output values for the filter, is loaded with estimated output values by estimating the tap weights. The filter is placed in operation, and the outputs compared to the desired outputs. The errors are then used as tap weights for another "error" filter, and another table is created based upon these errors and the inputs. The outputs of that table are corrections to the tap weights of the original filter.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIGS. 4A and 4B shows one possible embodiment of a look-up table constructed according to the present invention.

DETAILED DESCRIPTION OF THE PREFERRED EMBODIMENT

Figure 1:
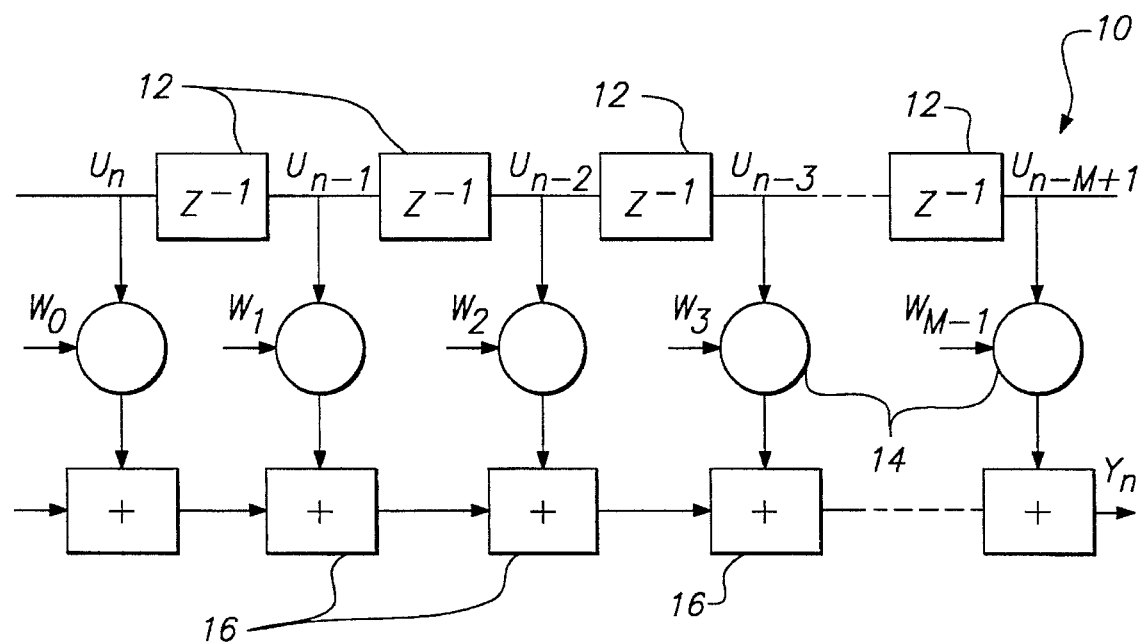
FIG. 1 shows a transversal filter of the prior art.

FIGS. 1 through 24 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The input/output relationship of a FIR filter is described by the same equation as the transversal filter above, i.e.

$$Y_n = \sum_{k=0}^{M-1} U_{n-k} * W_k \qquad (2)$$

Where the input is specified by a string of L digital bits, it may be represented by the equation $$U_{n-k} = \sum_{i=0}^{L-1} u_{i,n-k} * 2^i \qquad (3)$$

Substituting equation 3 in equation 2 yields $$Y_n = \sum_{k=0}^{M-1} \left( \sum_{i=0}^{L-1} u_{i,n-k} * 2^i \right) * W_k \qquad (4)$$

Reversing the order of summation yields $$Y_n = \sum_{i=0}^{L-1} \left( \sum_{k=0}^{M-1} u_{i,n-k} * W_k \right) * 2^i \qquad (5)$$

Defining the inner part of equation 5 as $$S_{i,n} = \left( \sum_{k=0}^{M-1} u_{i,n-k} * W_k \right) \qquad (6)$$

leaves the output of the filter as described by the equation $$Y_n = \sum_{i=0}^{L-1} S_{i,n} * 2^i \qquad (7)$$

This shows that it is possible to represent the output of the filter digitally as powers of two, with each sample considered to be one bit, and the current bit and n−1 prior bits constituting a word or input vector of n elements representing the last n values of input. It is then possible to use this input vector as an address for a look-up table (LUT) which contains the inner product of equation 6 for the input defined by the input represented by the input vector at the address indicated by the input vector, thus allowing the filtering to be done without the adders and multipliers needed by conventional filters.

Figure 2:
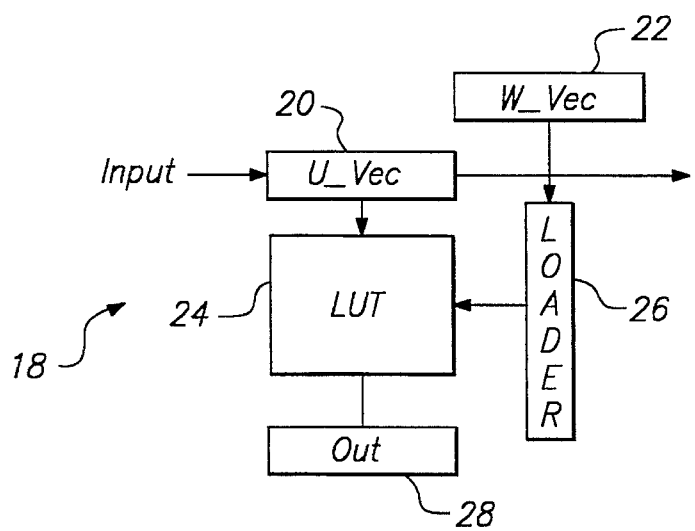
FIG. 2 is a simplified block diagram of a programmable FIR filter constructed according to a first embodiment of the present invention.

FIG. 2 shows a simplified block diagram of a programmable FIR filter 18 constructed according to the present invention. The input data is used to create an input vector having as its elements the n most recent values of the input signal to be filtered. This input vector is stored in the input vector register 20, and used to address the LUT 24. A coefficient memory 22 holds the value of the weighting vector coefficients. LUT 24 contains a number of entries, each corresponding to a different input vector and holding the inner product of the corresponding input vector and the weighting vector as given by equation 6 above. A loader 26 allows LUT 22 to be programmed with the desired output value for each input. An output register 28 holds the output which corresponds to the input vector.

To simplify the creation of the LUT 24, it is important that the table entries be carefully organized. If P is the table content, and $g_k$ is the input vector of n elements composing the cell pointing address, then the table content is related to the cell pointing address by the equation $$P_k = \sum_{k=0}^{M-1} g_k * W_k \tag{8}$$

and the actual cell location is the gray to binary code conversion of the pointing address. This allows the gray code to be used to calculate the table rather than calculating each entry independently if the entries are put in the correct order such that each consecutive input vector changes by only one element.

More specifically, since the input vector elements are signed binary elements, two input vectors differing only in one bit location (Hamming distance=1) will have associated inner products (equation 6) which differ by twice the weighting coefficient which applies to the particular bit position at which the two vectors are different. The loading sequence takes advantage of this characteristic by following a gray counter spanning the input vector space, and using a register which holds the inner product of the input vector defined by the gray counter.

Figure 3:
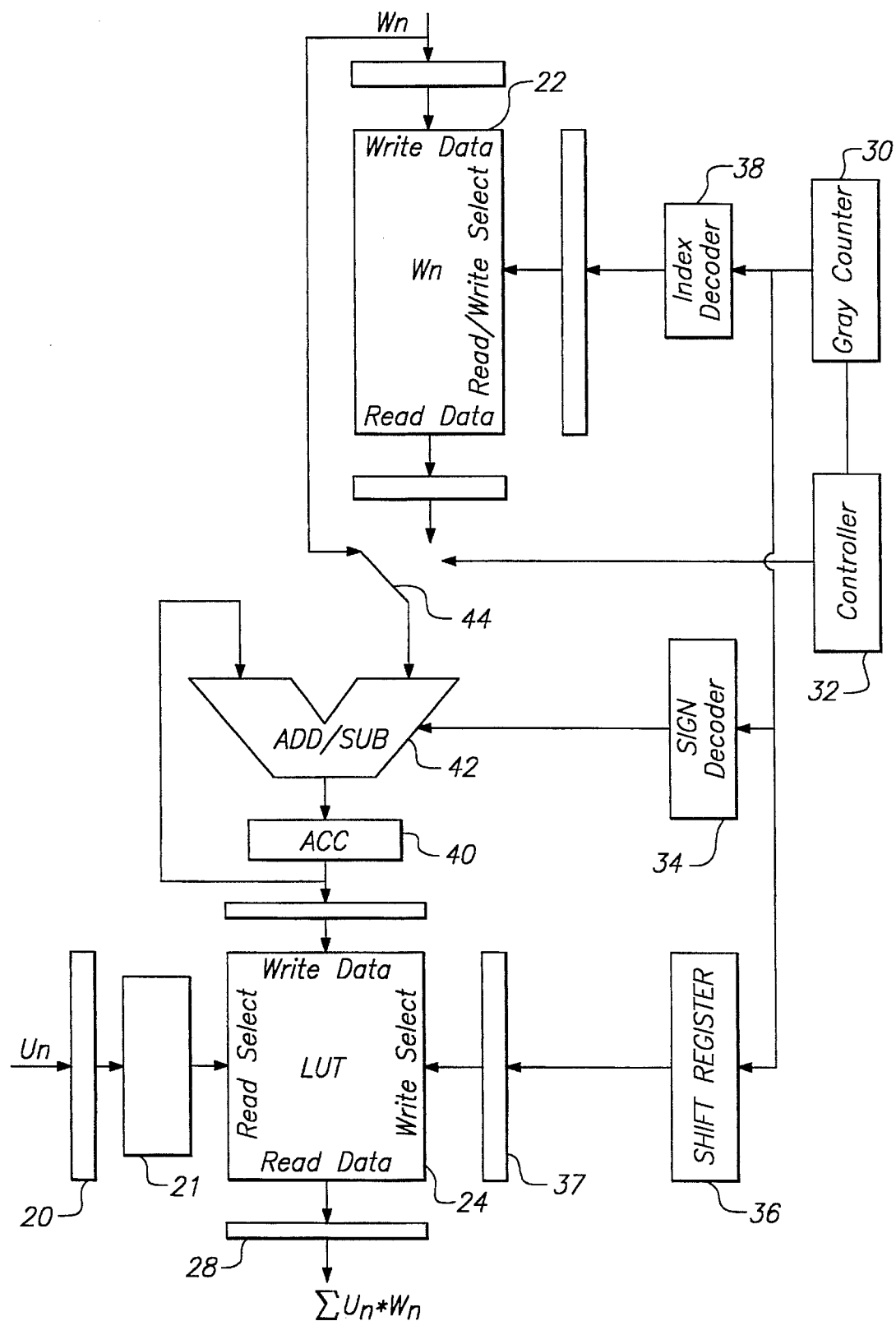
FIG. 3 is a more detailed block diagram of a programmable FIR filter constructed according to a first embodiment of the present invention.

A more detailed block diagram of a programmable FIR filter is shown in FIG. 3. Similar designations are used for similar elements as in FIG. 2. An initial all-zero input vector is first selected, and its corresponding output calculated based upon the selected weight vector and stored in both LUT 24 and register 40. The weighting coefficients are also stored in coefficient memory 22 as above. A gray counter 30, comprised of a regular binary counter and an encoder from binary to gray code, is then incremented by controller 32 to generate a gray code sequence. As each element of gray counter 30 changes, the weighting coefficient corresponding to the element of the input vector which changes is selected by index decoder 38, shifted by one bit location to account for the factor 2 as above, and sent to adder 42.

Depending upon whether the bit changed in gray counter 30 changed from 0 to 1 or 1 to 0, sign decoder 34 instructs the adder 42 to add or subtract the shifted weighting coefficient to or from the previous value in register 40. Register 40 thus now holds the new inner product between the input vector represented by the value of gray counter 30 and the weighting vector, and this new value is loaded into the cell in LUT 24 which is addressed by the input vector represented by gray counter 30. Controller 32 instructs shift register 36 to select the appropriate row of LUT 24 into which this value is to be stored. Shift register 36 generally remains in sequence with binary counter 30; however, in appropriate cases a separate decoder 37 may be used.

It can thus be seen that if the cells are arranged in an order such that adjacent entries relate to gray codes which differ by only a single bit, the loading sequence merely requires writing to successive cells (rows). This is easily implemented by shift register 36, as the next write address of LUT 24 is merely the result of shifting a single bit to select the next cell.

In the preferred embodiment, LUT 24 is a dynamic random access memory (DRAM) which has dual ports and which supports contention, i.e. which allows information to be written to it at one port at the same time it is being read at the other port. This may be necessary to protect the integrity of the data and to prevent the filter from being interrupted in operation. In an alternative embodiment, contention may be prevented by splitting the access cycle and using the first portion of the cycle for writing and the second portion for reading, such that there is no overlap between writing and reading. But this requires a faster access memory, which adds to the cost of the system.

In addition, information in a DRAM decays over time, and the DRAM has a limited retention time during which the information originally loaded remains valid. Thus, even if the information in the table is not intended to be changed, the DRAM must be refreshed within the retention time to insure that the data obtained is valid. Thus, in the preferred embodiment, the data in LUT 24 is constantly refreshed even when it is not changed. The load cycle is short relative to the retention time, so that the refresh may either be continuous or may be done periodically as long as it is within the retention time. Periodic refresh uses less power than a continuous refresh.

Alternatively, a static random access memory (SRAM) may be used, and in this case LUT 24 need only be reloaded when the data is to be changed, as the SRAM retains data indefinitely. Also, if an SRAM is used it is not necessary that contention be supported.

Switch 44 is shown in the "write" position which allows LUT 24 and coefficient memory 22 to be loaded at the same time to save loading time. As will be seen below, in the preferred embodiment the first entry in LUT 24 is the inverse of the sum of all of the coefficients. Thus, when the coefficients are first written to coefficient memory 22 and LUT 24, adder 42 and accumulator 40 sum the coefficients to create that first entry. After these are loaded, switch 44 is moved to the other or "read" position so that coefficients are only read from the coefficient memory 22, based upon an index as explained below, and fed to adder 42. Note that since the coefficient memory 22 is not written to and read at the same time, it need not be a dual port memory. The input vector is stored in input vector register 20 and decoded by decoder 21 as explained below.

FIGS. 4A and 4B show a look-up table constructed according to the present invention. In this example, the FIR filter has 6 taps. Normally, to allow a separate output for each input would require $2^6$ or 64 entries. However, for reasons which will be explained below, an input vector composed of five elements requiring only 32 entries is sufficient to identify the possible inputs from the six taps. Each cell in the table is a row, with a row number as shown in the first column. The second column shows the input vector $g_k$. As described above, the initial input vector is all zeroes, and each subsequent input vector differs from the one preceding it by only one input. Also, for reasons which will be apparent, the particular order of entries is important.

The third column shows the contents of the table cell, i.e. the row. For this illustration it is assumed that a zero as the kth element in the input vector results in a factor of $-h_k$ in the output, and that a one as the kth element results in a factor of $+h_k$ in the output. Thus, for the initial input vector of all zeroes, as stated above the output is comprised of the inverse of the sum of all of the $h_k$ factors.

The fourth column shows the change in the table cell content from the cell above it. Thus, since the input vector for row 1 differs from that of row 0 by changing $g_0$ from a 0 to a 1, and since that has the effect of changing the corresponding factor of the output from $-h_0$ to $+h_0$, the overall output has increased by $h_0*2$. Depending upon what the change in the input vector is between two rows, the increment may be positive, if an input vector element changes from a 0 to a 1 as here, or negative, if an input vector element changes from a 1 to a 0, as, for example, from rows 2 and 3.

The fifth column shows the sign of the increment, again positive or negative as explained above. The sixth column shows the order of the change, i.e. which element of the input vector, and thus which factor of the output, has changed. Thus, in row 1, the change is in $g_0$ and $h_0$, so that the change in output is of the 0th order. Similarly, since in row 2 the change is in $g_1$ and $h_1$, the change is of the 1st order.

The last column simply shows the row number in binary form, i.e. the contents of shift register 36 when the cell contained in that row is loaded or accessed.

Figure 5:
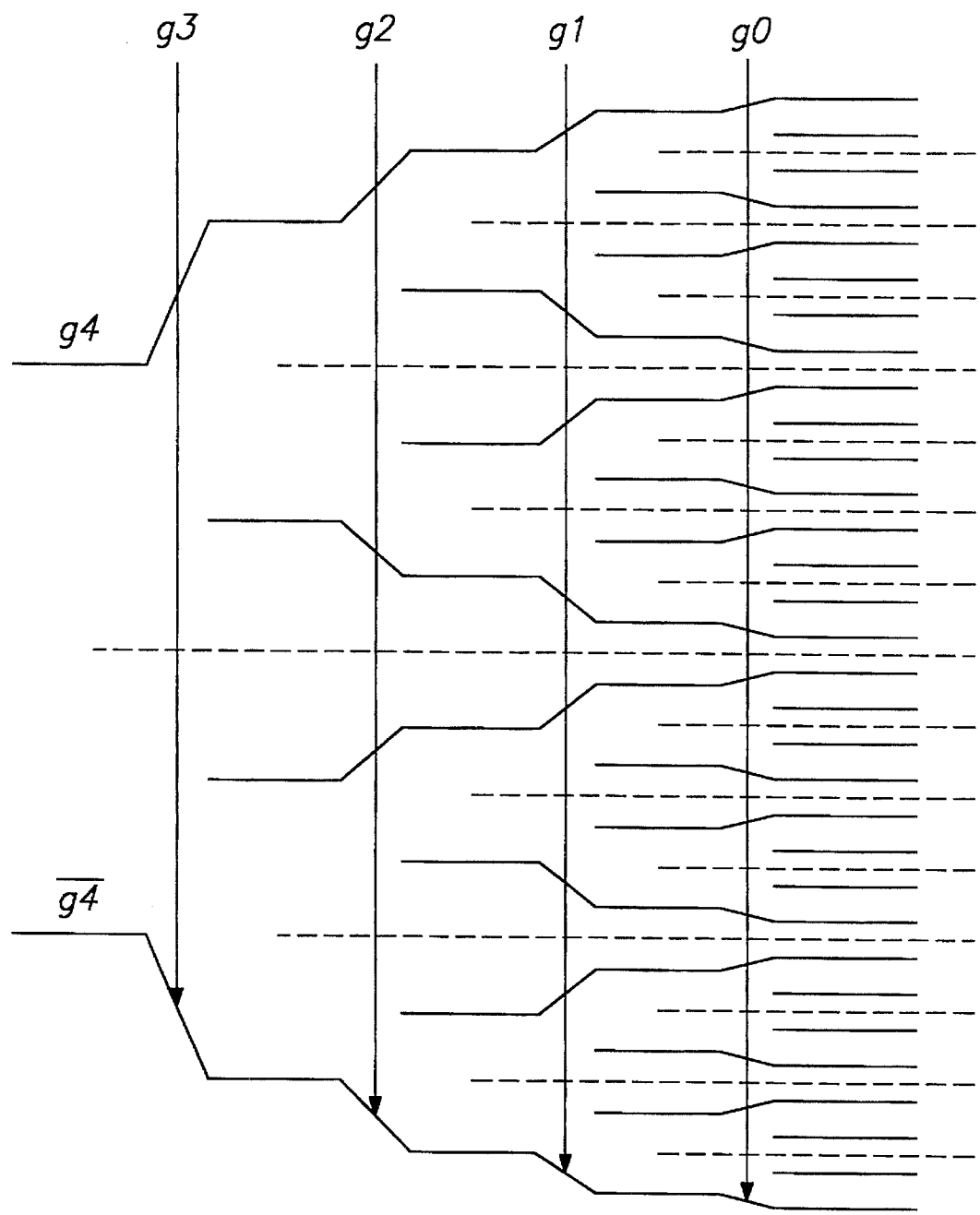
FIG. 5 shows one possible embodiment of a look-up table address decoder for reading the look-up table of FIGS. 4A and 4B.

Reading the look-up table is equally simple. For example, a standard tree style decoder such as is shown in FIG. 5 may be used as decoder 21 on FIG. 3. The decoder is here shown comprised of a decision tree of single pole-double throw switches which are caused to be in one position or the other depending upon whether each element $g_3$ to $g_0$ of the input vector is a 1 or a 0. The element $g_4$ serves as the input to the tree. In this example, the switches are shown in a normally closed position when the corresponding element of the input vector is a 0 and a row is selected when a 0 is propagated to the end position. Thus, the input vector is all zeroes, and the top line shows the switches in position to select row 0, since the input to the tree is a 0 and all the switches are in the 0 position. The bottom line shows the switches in position to select row 31, since $g_4$ is a 1 and the remaining elements of the input vector are zeroes. However, since the input to this line is a 1, the row is not selected. Other types of decoders may also be used.

Figure 6:
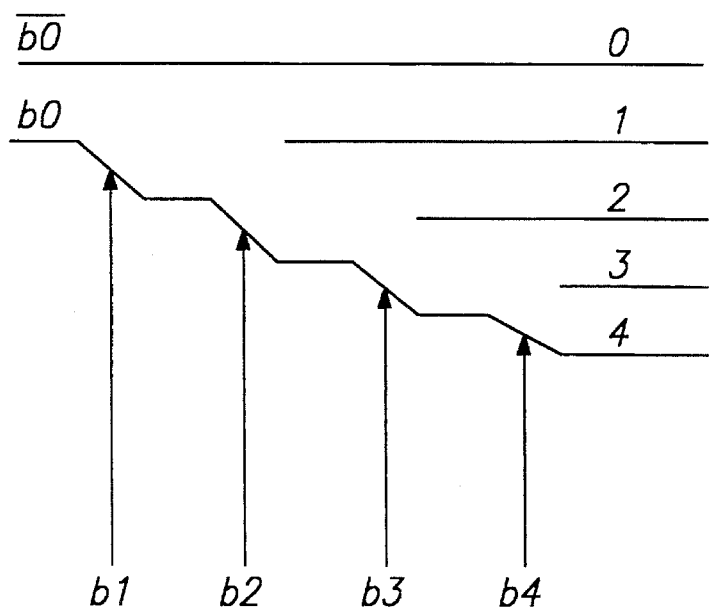
FIG. 6 shows one possible embodiment of a coefficient index decoder for determining the coefficient index of a particular entry in the look-up table.

FIG. 6 shows one possible embodiment of a coefficient index decoder such as index decoder 38 in FIG. 3 for determining the coefficient index of a particular entry to be loaded in the look-up table. Similar to the look-up table address decoder of FIG. 5 but somewhat reversed, a tree of switches is used to decode the binary representation of the row number to obtain the index contained in the sixth column of the look-up table of FIGS. 4A and 4B. This tree determines the order of the increment as described above by in effect counting the number of zeroes to the right of the right-most 1 in the row number. As with FIG. 5, the switches are shown in a closed position where a 0 is present. Here again a line is selected where a 0 is present on it. Note that whenever $b_0$ is a 1, the coefficient index is 0. This is consistent with the look up table shown in FIGS. 4A and 4B. This decoder is used for easily loading the look up table.

Figure 7:
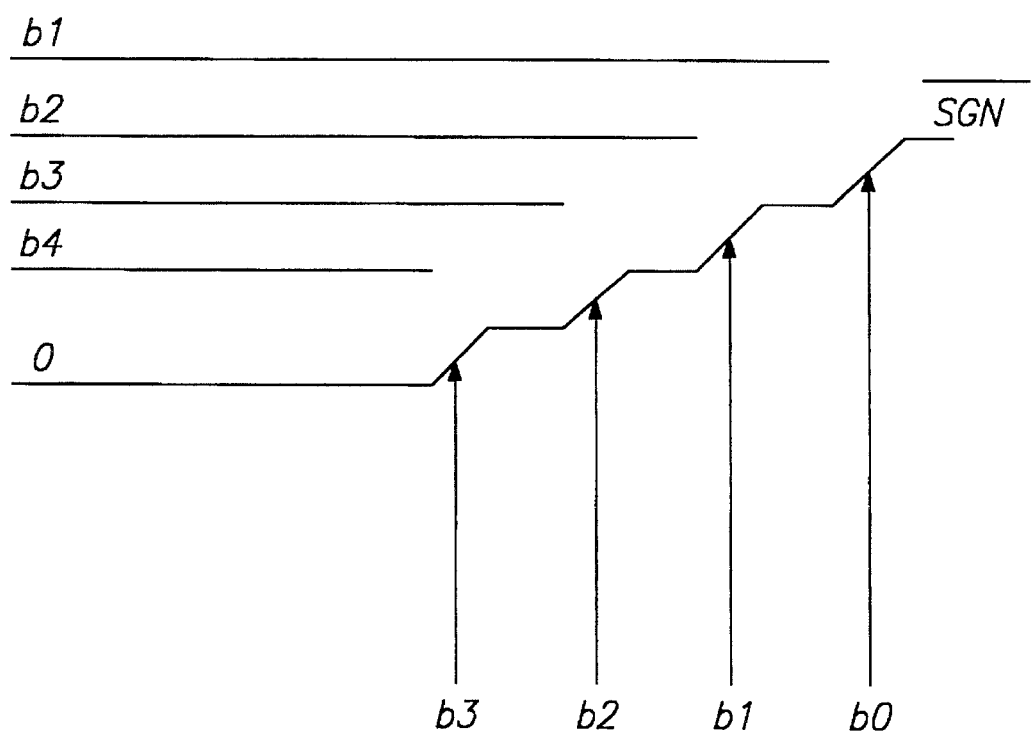
FIG. 7 shows one possible embodiment of a coefficient sign decoder for determining the coefficient sign of a particular entry in the look-up table.

FIG. 7 shows one possible embodiment of a coefficient sign decoder such as sign decoder 34 in FIG. 3 for determining the sign of a particular entry to be loaded in the look-up table. Again, a tree of switches is used to here decode the binary representation of the row number to obtain the sign contained in the fifth column of the look-up table of FIGS. 4A and 4B. In this case, however, the tree is generally reversed from that of the coefficient index decoder of FIG. 6, and determines the sign by in effect finding the digit to the left of the right-most 1 in the row number. If that next digit is a 0, the sign is positive, while if the digit is a 1, the sign is negative. Again, the switches are shown in a closed position when a 0 is present, and the sign is selected when a 0 is present on the line. Thus, if $b_0$ is a 0 and $b_1$ is a 1, then the sign is dictated by $b_2$. If $b_2$ is a 0, the sign is positive, while if it is a 1 the sign is negative. If $b_0$ to $b_3$ are all 0, then a 0 is selected and the sign is positive (this is row 16 of the table in FIG. 4B).

Figure 8:
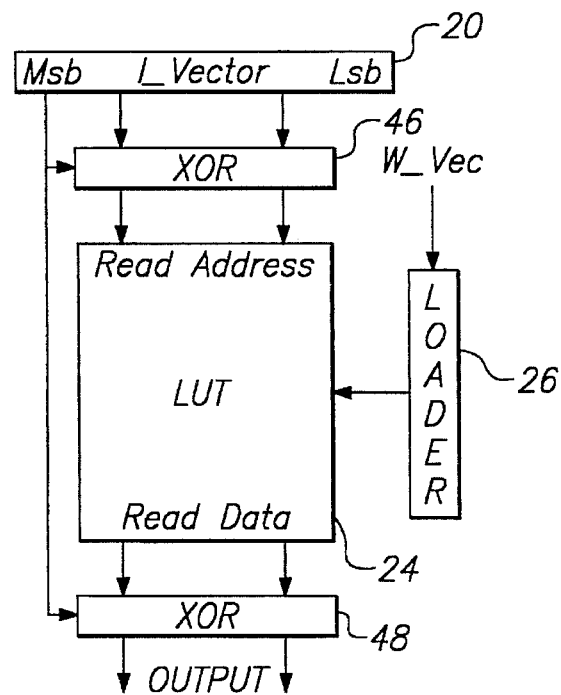
FIG. 8 is a simplified block diagram of a programmable FIR filter constructed according to a second embodiment of the present invention in which the look-up table is reduced in size.

FIG. 8 shows another embodiment of the programmable FIR filter of the present invention, in which the memory saving technique referred to above is implemented. As mentioned above, the look up table shown in FIGS. 4A and 4B contains only 32 entries although the input vector is shown as having 6 bits, which requires 64 entries to have a separate output for each input. A closer examination of the two parts of the look-up table of FIGS. 4A and 4B shows that each entry begins with a factor of $-h_5$, thus indicating as above that $g_5$ is a 0 for all entries in the table. Since this half of the table contains all of the possible entries for $g_0$ to $g_4$, the other half of the table must contain all of the same entries except that the first factor of $-h_5$ becomes a $+h_5$. Thus, for the 6 tap filter referred to with respect to FIGS. 4A and 4B above, which would normally require 64 entries, again only 32 entries are needed.

One way to determine the other 32 entries would be to analyze $g_0$ to $g_4$, read the entry of the look up table corresponding to that portion of the input vector, and then add $2*h_5$ if $g_5$ is a 1. But this requires another adder, which adds either 0 or $2*h_5$ depending upon the most significant bit of the input vector, and a controller to cause the adder to add the appropriate number.

In the present invention mother solution is used. Here, using row 1 as an example, except for the $g_5$ input, the input vector of row 20 is the inverse of the input vector of row 1. Consequently, except for the $h_5$ output factor, the output of row 20 is also the inverse of the output of row 1. Thus, when $g_5$ is a 0, the look up table is read normally, and the output obtained as described above. When $g_5$ is a 1, however, $g_0$ to $g_4$ are inverted and the row addressed by that inverted input vector is read and the output inverted. Note that it is not necessary to do anything else to obtain the output, since the $h_5$ output factor is inverted by inverting the output, and the remaining output elements are re-inverted after having been inverted by the inversion of the input vector.

Thus, in FIG. 8 there are two XOR elements 46 and 48. Depending upon the most significant bit (MSB) $g_5$ of the input vector, the first XOR 46 element either reverses the remaining elements $g_0$ to $g_4$ of the input vector or transmits them as they are received. If this part of the input vector is reversed, the second XOR element 48 also reverses the output. The mathematics of this are shown in Appendix A. The use of the inverters is simpler than the adder and controller mentioned as another alternative above, and is more efficient that having a look up table twice as large.

Figure 9:
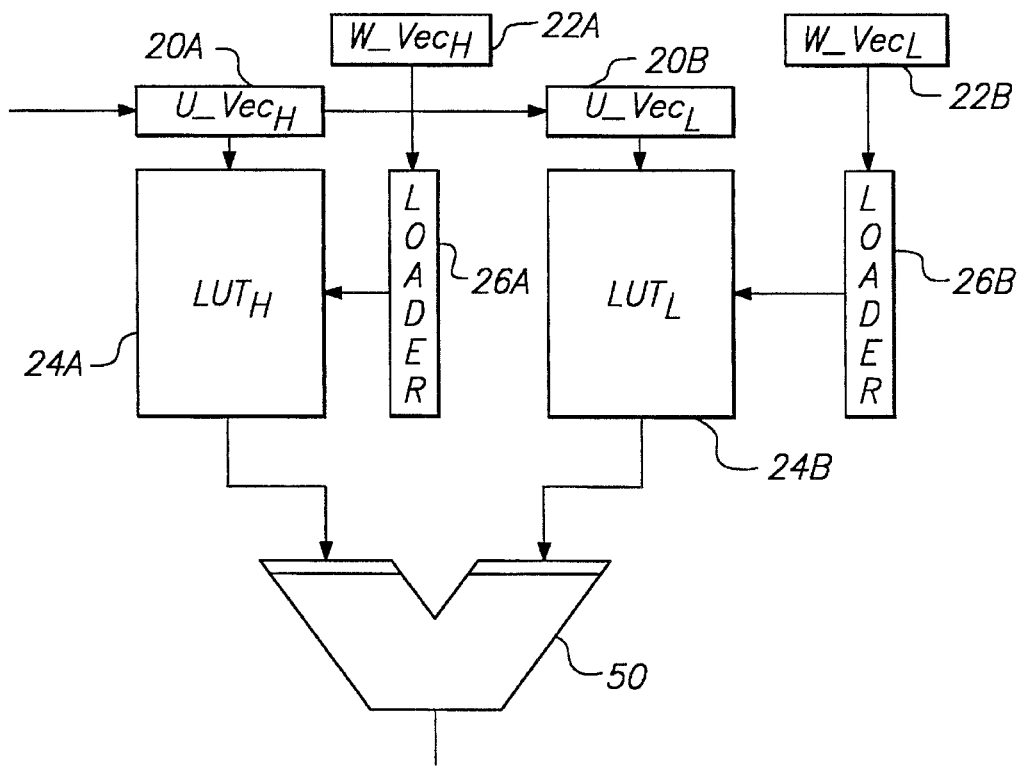
FIG. 9 is a simplified block diagram of a programmable FIR filter constructed according to a third embodiment of the present invention in which the look-up table is partitioned.

FIG. 9 shows a third embodiment of the present invention in which the look-up table is partitioned into two LUTs 24A and 24B. Other elements shown in FIG. 2 are also partitioned. This may done where, for example, there are too many inputs to keep the look-up table to a manageable size. In this case, the high order inputs, i.e. first in time, are used to access LUT 24A and the low order inputs, i.e. later in time, are used to access LUT 24B, each of which is loaded and accessed as described above. Adder 50 then sums the outputs of LUT 24A and 24B to produce the overall output of the filter.

Figure 10:
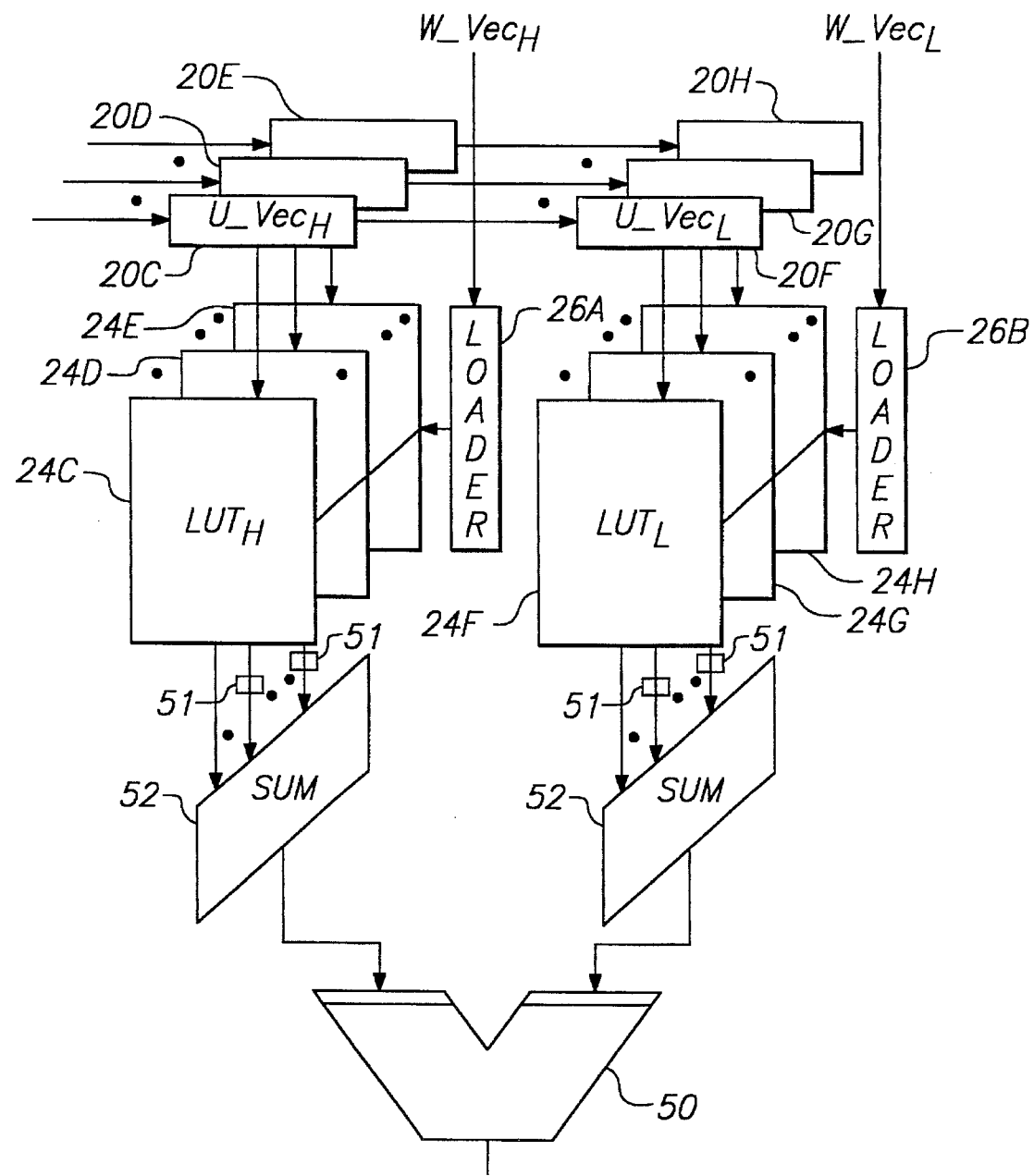
FIG. 10 is a simplified block diagram of a programmable FIR filter constructed according to a fourth embodiment of the present invention in which a plurality of look-up tables operate in parallel.

In the above illustrations, it is assumed that each input is a single bit. FIG. 10 shows a fourth embodiment of the present invention in which a plurality of look-up tables operate in parallel. This may be used, for example, where each element of the input string is more than one bit. In FIG. 10, each element of the input string is shown as 3 bits with one bit being the most significant bit and one the least significant. Also, as in FIG. 9, there are too many inputs for a single table to be manageable. Here the input string is first broken into high and low order inputs, as in FIG. 9, with the three bits of each high order input being provided by registers 20C, 20D and 20E, and the three bits of each low order input being provided by registers 20F, 20G and 20H. There is a separate LUT for each bit of the high order inputs and each bit of the low order inputs. Thus, LUTs 24C, 24D and 24E are accessed by the respective bits of the high order inputs, and LUTs 24F, 24G and 24H are accessed by the respective bits of the low order inputs. Each LUT is loaded as described above using the appropriate weighting coefficients, and then accessed first by the string of the most significant bits, then the string of the next most significant bits, and so on until the string of the least significant bits. The output corresponding to the string of the most significant bits is taken as is, while those corresponding to other bits are shifted by shifters 51 to compensate for their significance. Thus, the output corresponding to the string of next most significant bits is shifted by one bit, and the next by two bits and so on, so that where there are M bits in each element of the input string, the output corresponding to the string of least significant bits is shifted by M−1 bits, or 2 bits in the illustration of FIG. 10. The shifted outputs from all of the LUTs are then added by adders 52 and 50 to obtain the overall output of the filter.

Figure 11:
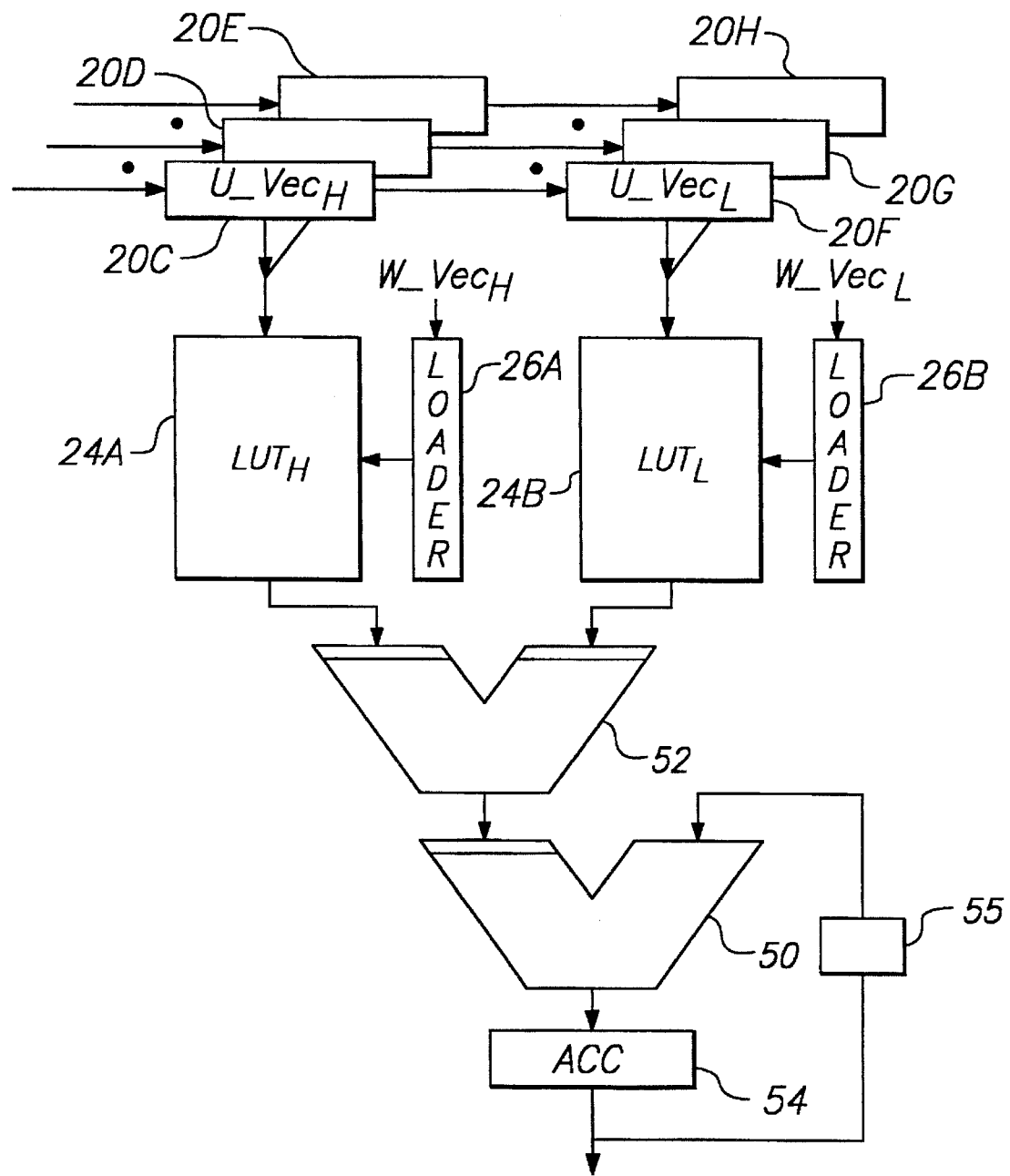
FIG. 11 is a simplified block diagram of a programmable FIR filter constructed according to a fifth embodiment of the present invention in which the look-up table is accessed in a multiplexed scheme.

FIG. 11 shows a fifth embodiment of the present invention in which inputs of more than one bit which go from most significant bit to least significant bit are multiplexed rather than treated in parallel as in the embodiment shown in FIG. 10. As in FIG. 9, it is assumed that the number of inputs is too great for one LUT. As in FIG. 10, the multiple bits of each input are provided by registers 20C–H. Now however, there are only two LUTs 24A and 24B as in FIG. 9, LUT 24A being for the high order inputs and LUT 24B being for the low order inputs. As in FIG. 9, the outputs of LUT 24A and LUT 24B are added to get the output for a given input. Now, however, since each input has more than one bit, each LUT must be accessed once for each bit, in the example shown here three times. The corresponding outputs for the first bits are then stored in a register 54. This value is then shifted by one bit by shifter 55, to compensate for the significance of the bits, and the outputs corresponding to the next bits of the inputs are then obtained and added to the prior results in register 54. If the first bit used is the most significant bit, then the shifter shifts left, i.e. multiplies by 2, while if the first bit is the least significant bit the shifter shifts right, i.e. divides by two. This process is repeated until all of the bits of the inputs have been used to access the LUTs to obtain the corresponding outputs, again three times in this illustration. The total in register 54 is then the output of the filter.

Figure 12:
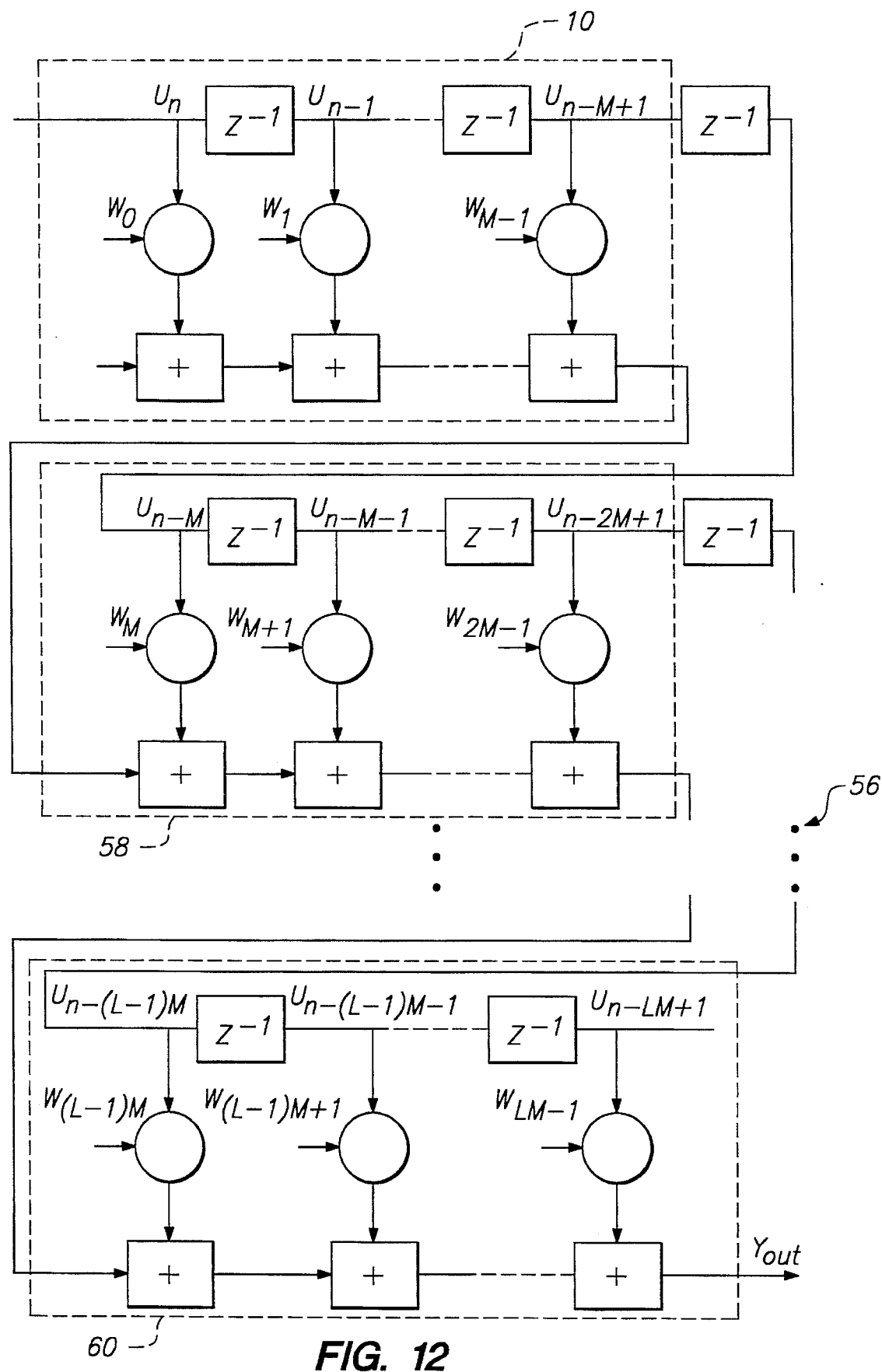
FIG. 12 shows another transversal filter of the prior art.

FIGS. 12 to 16 show a sixth embodiment of the present invention. In FIG. 12 a filter 56 of the LMth order, i.e. having L*M−1 delay elements, is shown. Thus, after the last delay element, $U_n$ has become $U_{n-(LM-1)}$ or $U_{n-LM+1}$. As shown by the configuration of the filter 56, this can be represented as L separate filters, each of the Mth order, with another delay unit in between each consecutive pair of filters. Thus, the first Mth order filter 10 is identical to that of FIG. 1. The output of filter 10 is delayed once and becomes the input to the second filter 58. The output of the Lth filter 60 is the output of the overall filter 56.

Figure 13:
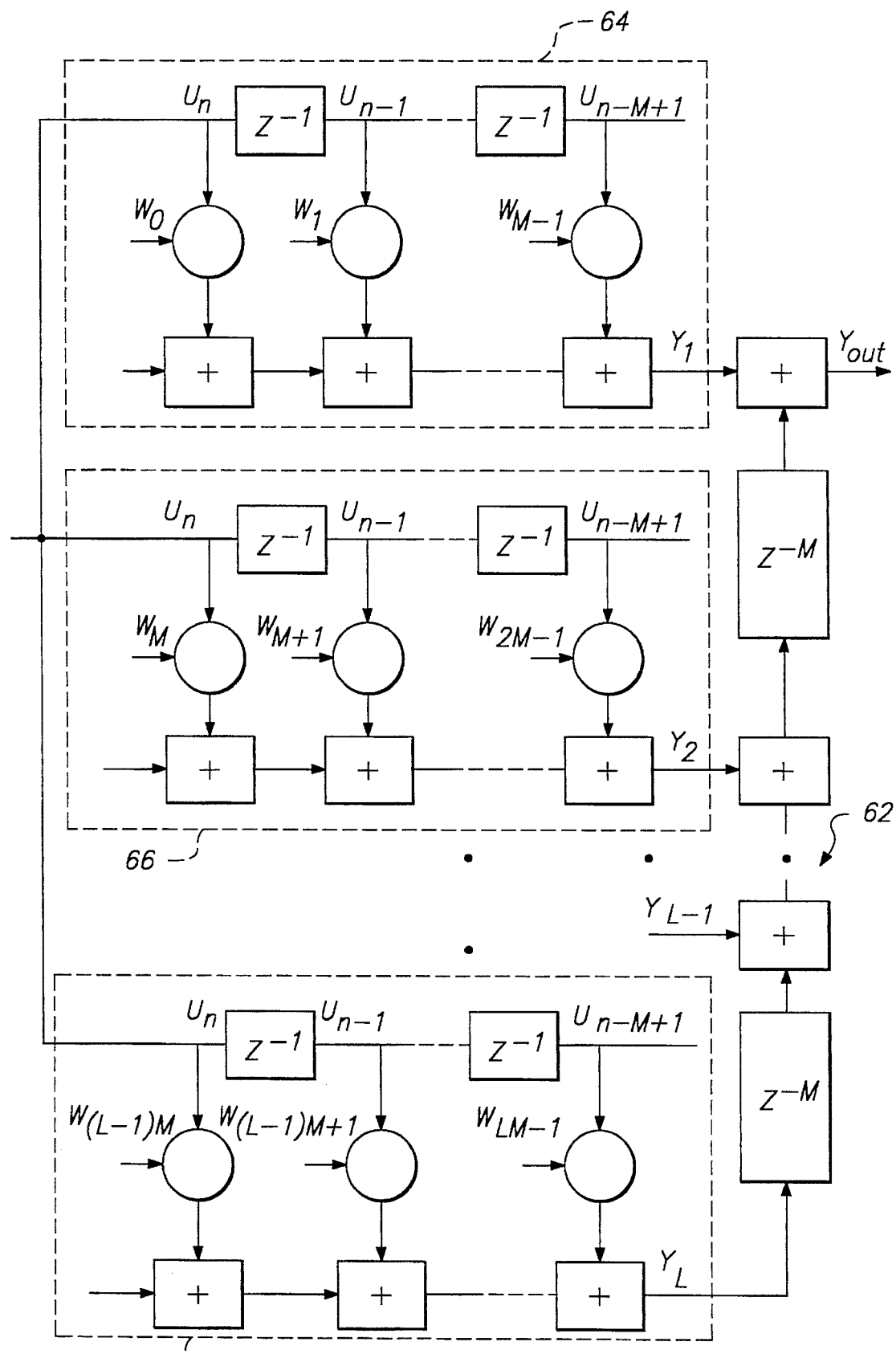
FIG. 13 shows another way of constructing the transversal filter of FIG. 12.
Figure 14:
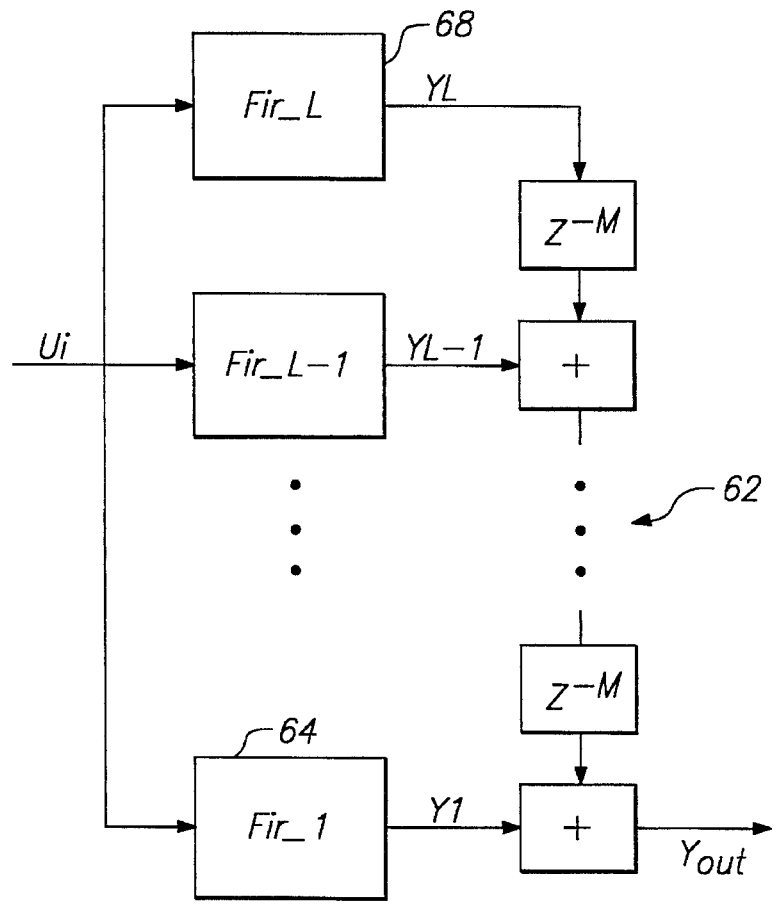
FIG. 14 is a simplified block diagram of the transversal filter of FIG. 13.

The filter 56 can be reconfigured as shown in FIG. 13 to be an equivalent filter 62, in which there are L separate filters, each of the Mth order, and each having the same input $U_n$, where the outputs $Y_1$, where l=1 to L, of each filter are delayed M(l−1) times. Thus, the output $Y_1$ of the first filter 64 is not delayed at all, while the output $Y_2$ of the second filter 64 is delayed once by M units, and the output of $Y_L$ of the Lth filter is delayed M(L−1) times. These delayed outputs are summed to obtain the overall output of filter 62. This approach allows the input to be fed to each filter without having to go through all of the delay elements of the overall filter. In FIG. 14 the filter 62 is shown in block diagram form.

Figure 15:
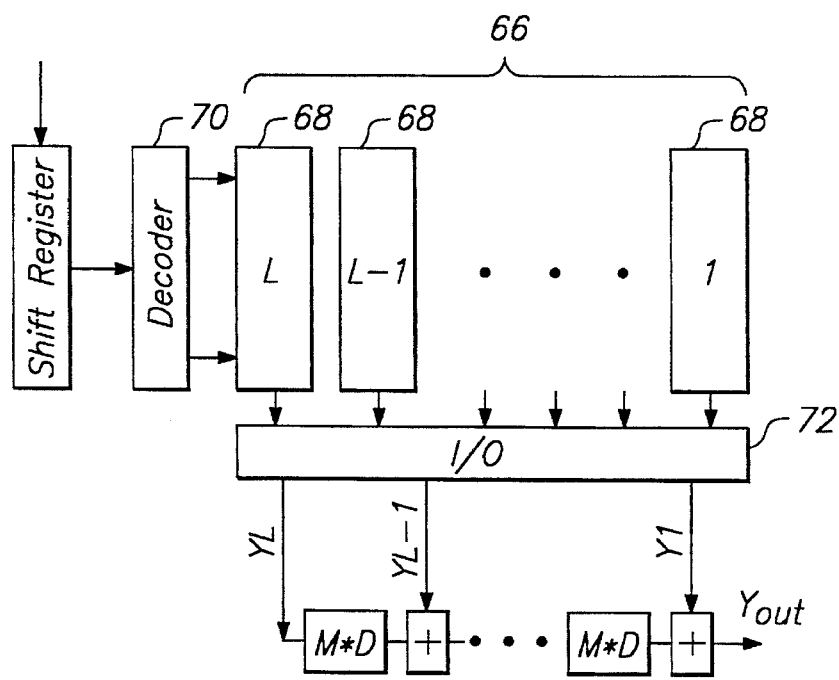
FIG. 15 is a simplified block diagram of a programmable FIR filter comparable to the filter of FIG. 13 constructed according to a sixth embodiment of the present invention.

FIG. 15 shows one way in which the filter 62 can be implemented using the present invention. Here there is a single LUT 66 having multiple fields 68. Each field contains the outputs for one of the L filters contained in filter 62. Alternatively, there may be a separate LUT for each filter. Since the inputs to each filter are the same, a single address decoder 68 is shared by all of the fields of LUT 66, or alternatively by all of the LUTs. In the various embodiments above, there is a separate address decoder for each LUT. Thus, this approach eliminates the need for multiple address decoders. The output of each field is delayed once and then added to the output of the next field, with the output of the filter being the delayed outputs added to the output of the first field as shown. Thus, the last, or Lth field is delayed L−1 times, and the output of the first field is not delayed at all.

Figure 16:
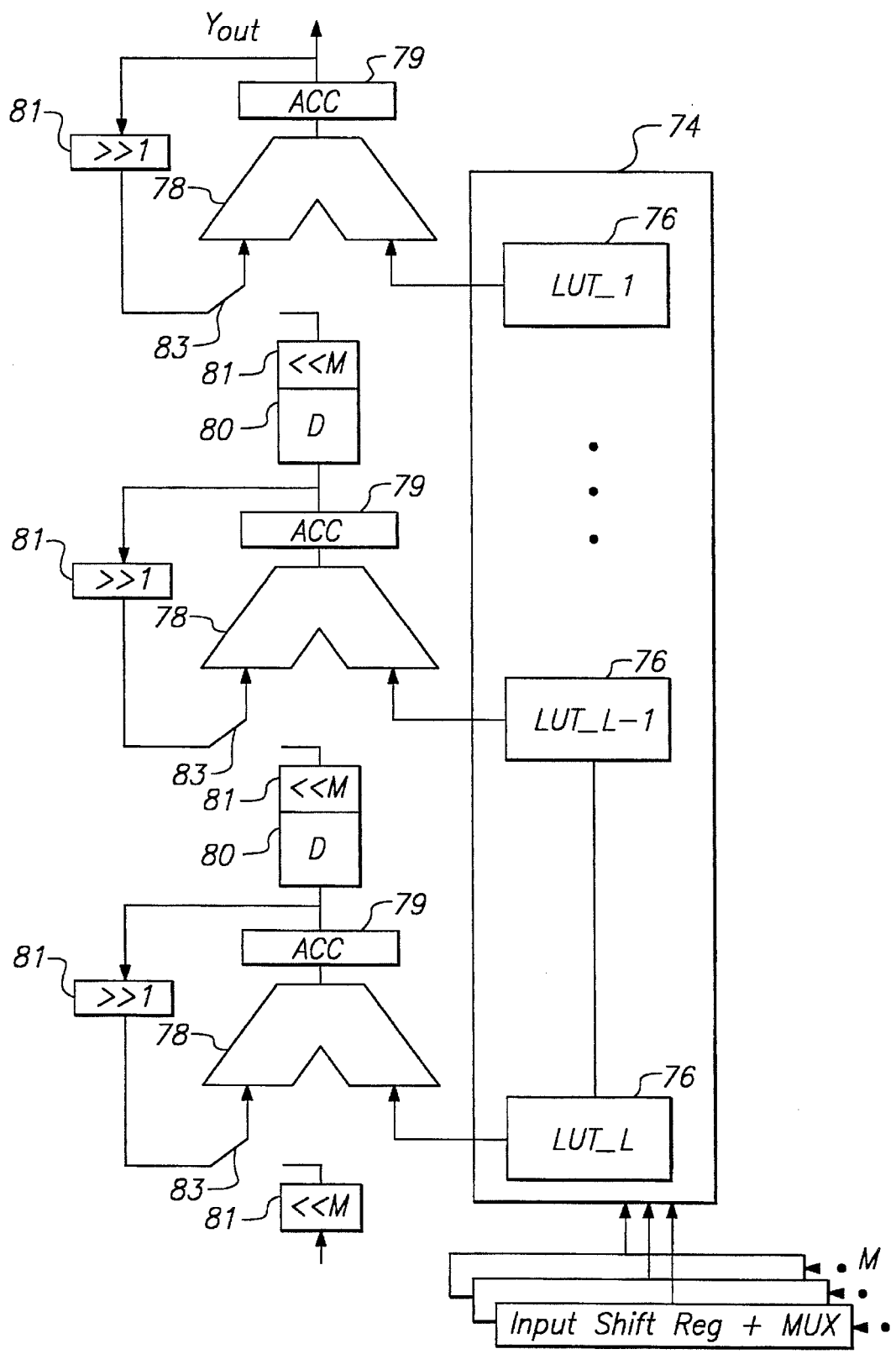
FIG. 16 is a simplified block diagram of a programmable FIR filter similar to the filter of FIG. 13 but constructed according to a seventh embodiment of the present invention in which the look-up table is accessed in a multiplexed scheme.

FIG. 16 shows another use of this embodiment, where as in FIG. 11 the input is more than one bit and is multiplexed to avoid the need for a separate LUT for each bit. As in FIG. 15, there is a single LUT 74 having multiple fields 76, or there may be separate LUTs. As in FIG. 15, each LUT receives the same inputs, and as in FIG. 11 each LUT is accessed once for each bit. Separate adders 78 receive the outputs of each field or LUT 76, starting with either the most significant bit or the least significant bit; the latter is shown here. Where there are M bits, each field or LUT 76 is accessed M times for each input string, and the output corresponding to each of the N input bits is fed to the corresponding adder 78. After each of these outputs is received and added to the previous output, the result is stored in an accumulator 79 and then shifted by one bit to the right by a shifter 81 as in FIG. 11 and then fed back to the adder 78. Once all of the M bits have been used to access the fields or LUTs 76 and the totals stored in the accumulators 79, switches 83 are moved to the other positions and the totals delayed by a delay period D by delay units 80 and shifted M bits in the opposite position from the shifters 81, as shown here to the left, to compensate for the M shifts done by shifters 81, and then fed to the next adder 78. The cycle is then repeated for the next input sample. This thus has the effect of implementing the filtering scheme of FIG. 15 for a multibit, multiplexed input. The mathematics of this are seen in Appendix B.

Adaptive Filtering

In adaptive filtering, the output of the filter is adjusted by comparing the actual output for a given input to a desired output. This is useful in two cases. First, if the desired output is known, for example when designing a filter which must have a given output for a given input, the actual output is easily compared to the stated desired input to obtain an estimated error. This allows one to design the filter which provides the desired output for a specified input.

In a second case, it is desired that a filter have only discrete output values. If the actual output is not discrete, it is quantized by picking the closest discrete output value and using the difference between the actual output and the quantized output as the estimated error.

There are various mathematical methods for error correction, such as the least mean squared method and the steepest descent method. In the preferred embodiment of the invention, the block least mean square method with a finite window is used. However, one skilled in the art will easily recognize that other methods may be easily substituted.

As above, the output of a filter is given by the equation $$Y_n = \sum_{k=0}^{M-1} U_{n-k} * W_k \quad (8)$$

In the general case, the coefficients $W_k$ may be complex, so that $$W_k = a_k + jb_k \quad (9)$$

where $a_k$ is a real number and $b_k$ is an imaginary number.

The estimated error $e_n$ is the difference between the desired output $D_n$ and the actual output $Y_n$ from equation 8 so that $$e_n = D_n - Y_n \quad (10)$$

The mean squared error J is given by the equation $$J = E[e * e^*_n] = E[|e_n|^2] \quad (11)$$

where $e^*_n$ is the conjugate value of $e_n$, i.e. having the same real part but the inverse of the imaginary part of $e_n$ so that when the two are multiplied together the square of the error is obtained without regard to the sign, and E indicates the average of the expression.

In the steepest descent method, the coefficient $W_k$ is changed in a direction such that the error decreases by modifying it by a factor proportional to its gradient. The gradient is defined by the equation $$\nabla_k(J) = \frac{\partial J}{\partial a_k} + j \frac{\partial J}{\partial b_k} \quad (12)$$

having complex parts as in equation 9, and the gradient vector is derived from equation 11 and then given by $$\nabla_k(J_n) = -2 * E[U_{n-k} * e^*_n] \quad (13)$$

The coefficient $W_k$ is then changed by the following equation $$W_k' = W_k + \tfrac{1}{2} * \mu * (-\nabla_k(J_n)) \quad (14)$$

Note that the negative of the gradient vector must be used since if the gradient vector is positive this means that changing the coefficient increases the error. The coefficients are always changed in the direction of decreasing the error. The constant $\mu$ is not arbitrary but has constraints which are well known in the art. By using this equation in a recursive manner, one will eventually arrive at a minimum error.

In implementing this in a filter according to the present invention, one may then derive a correction vector for the coefficients of $$\Delta W_k = \mu * E[U_{n-k} * e^*_n] \quad (15)$$

and the coefficient $W_k$ is modified as $$W_k' = W_k + \Delta W_k \quad (16)$$

This can be implemented in the present invention by focusing on the increment specified by equation 16 and in essence building another filter to derive the correction vector $\Delta W_k$ as shown in equation 15.

Figure 17:
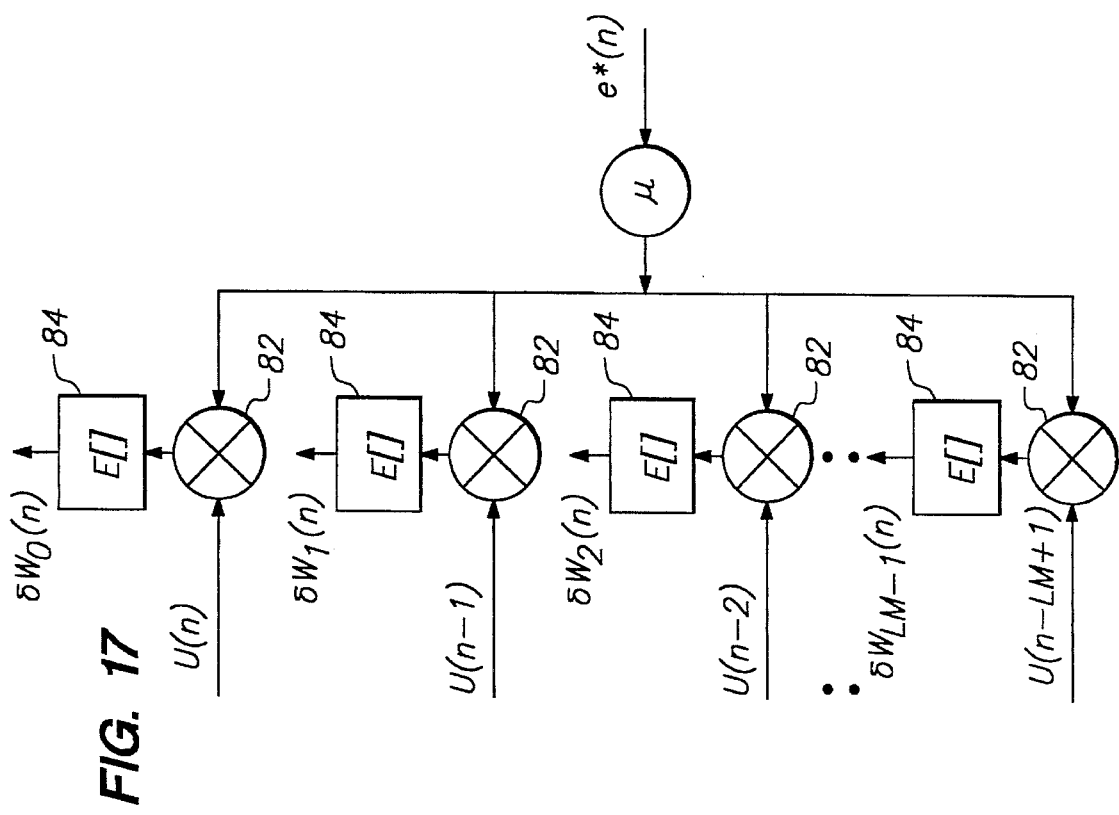
FIG. 17 shows a circuit which implements the steepest descent method of error correction.

FIG. 17 shows how this can be done. The conjugate value $e^*_n$ is multiplied by the constant $\mu$ and then fed to a series of multipliers 82 to be multiplied by the input vector $U_n$. The averages of the resulting outputs are then obtained by averagers 84 and are the elements of the correction vector $\Delta W_n$.

Figure 18:
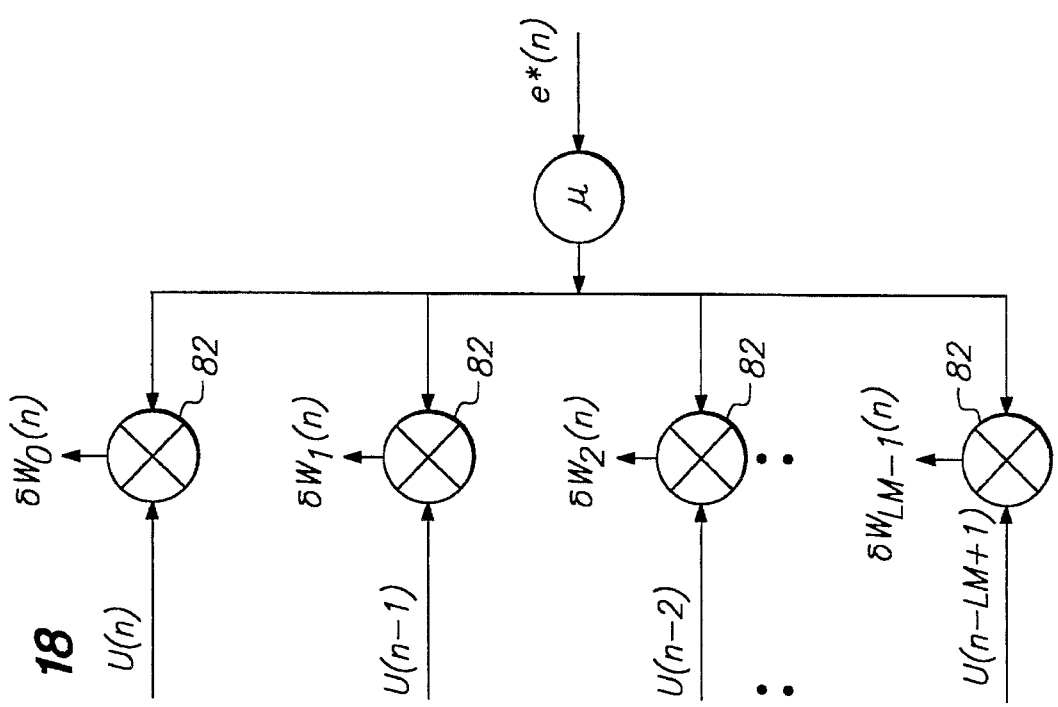
FIG. 18 shows a circuit which implements the least mean square method of error correction.

FIG. 18 shows an alternative way of calculating the correction vector without averaging. Here the conjugate value $e^*_n$ is multiplied by the constant $\mu$ and then multiplied by the input vector $U_n$ to obtain the correction factor $\Delta W_k$ based upon an instantaneous estimate of the gradient vector. Each correction factor now is simply $$\Delta W_k = \mu * U_{n-k} * e^*_n \quad (17)$$

This type of error correction will work and will obtain the minimum error although it is not as efficient as the averaging method; the output wanders and is noisier, and takes longer to converge, than where averaging is used. However, because the averages of the outputs of the multipliers 82 need not be calculated, it is simpler to implement than the filter of FIG. 17.

Figure 19:
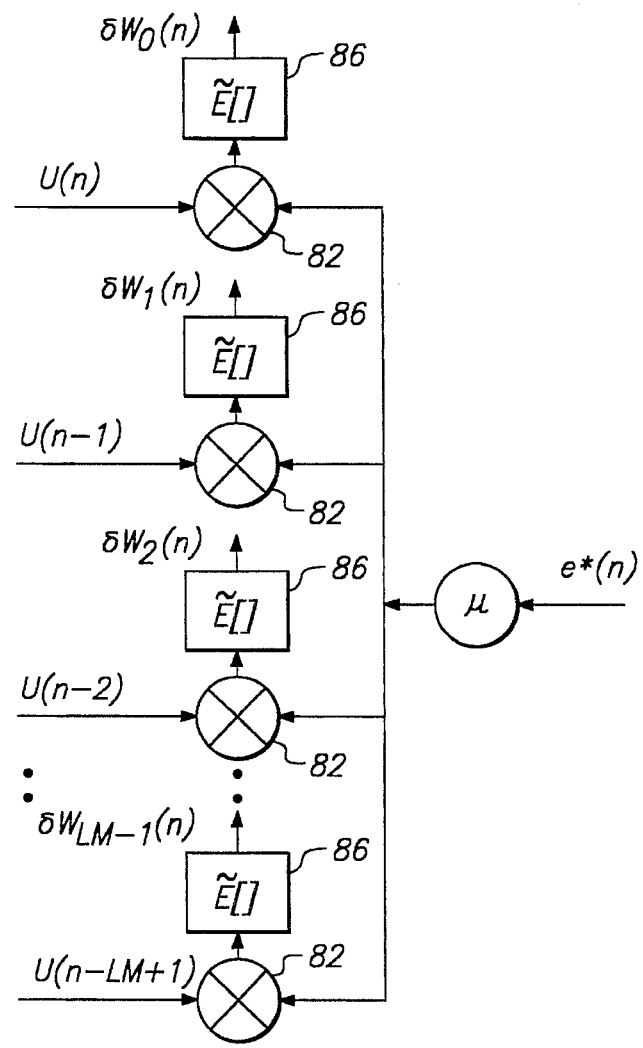
FIG. 19 shows a circuit which implements the block least mean square method of error correction.

FIG. 19 represents a compromise between these two approaches. This implements the block mean square method with a finite window. Now the error is not averaged completely, but only over LM consecutive points by averagers 86. Thus, it represents an improvement in efficiency over the instantaneous approach of FIG. 18, but is still easier to implement than the complete averaging approach of FIG. 17. The mathematics of this are shown in Appendix C.

Figure 20:
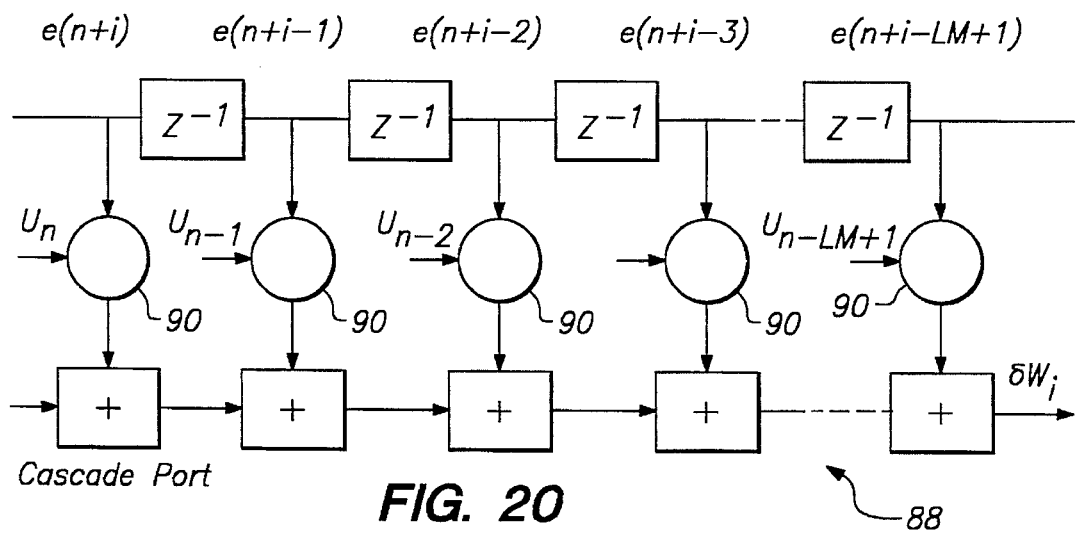
FIG. 20 shows a transversal filter which implements the error correction circuit of FIG. 19.

Again, this can be represented by a correlator or "correction filter" having LM taps as shown in FIG. 20. Here the estimated errors $e_n$ are the "inputs" of the correction filter 88, each delayed in sequence, and the real inputs $U_n$ are the coefficients applied to the estimated errors by multipliers 90. As usual, the outputs of the multipliers 90 are summed to obtain the correction vector. Appendix D shows the mathematics of this filter. As with FIGS. 12 and 13, this filter can be represented as a plurality L of filters each having M inputs as shown in FIG. 21

Figure 21:
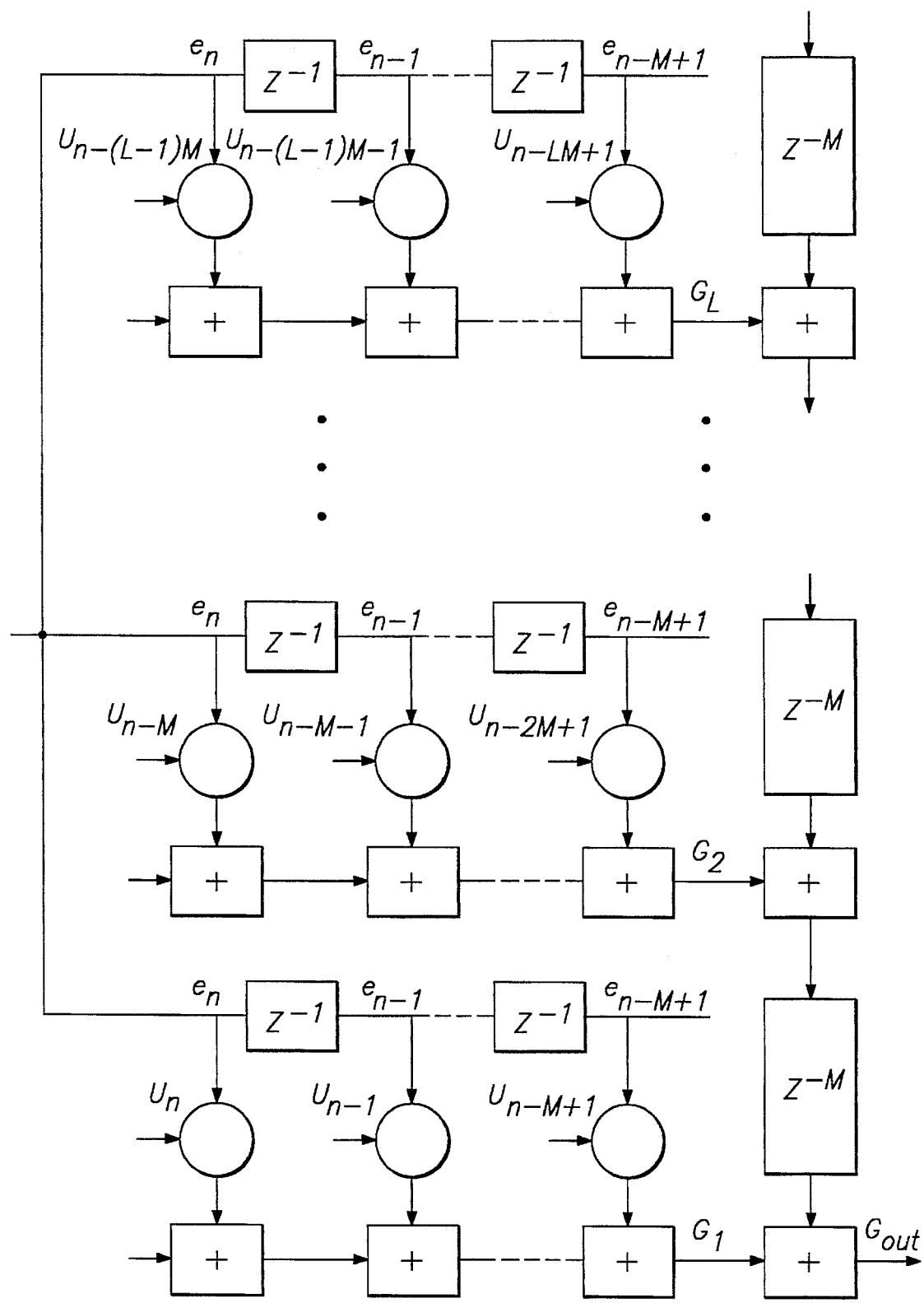
FIG. 21 is an alternative implementation of the error correction filter of FIG. 20.
Figure 22:
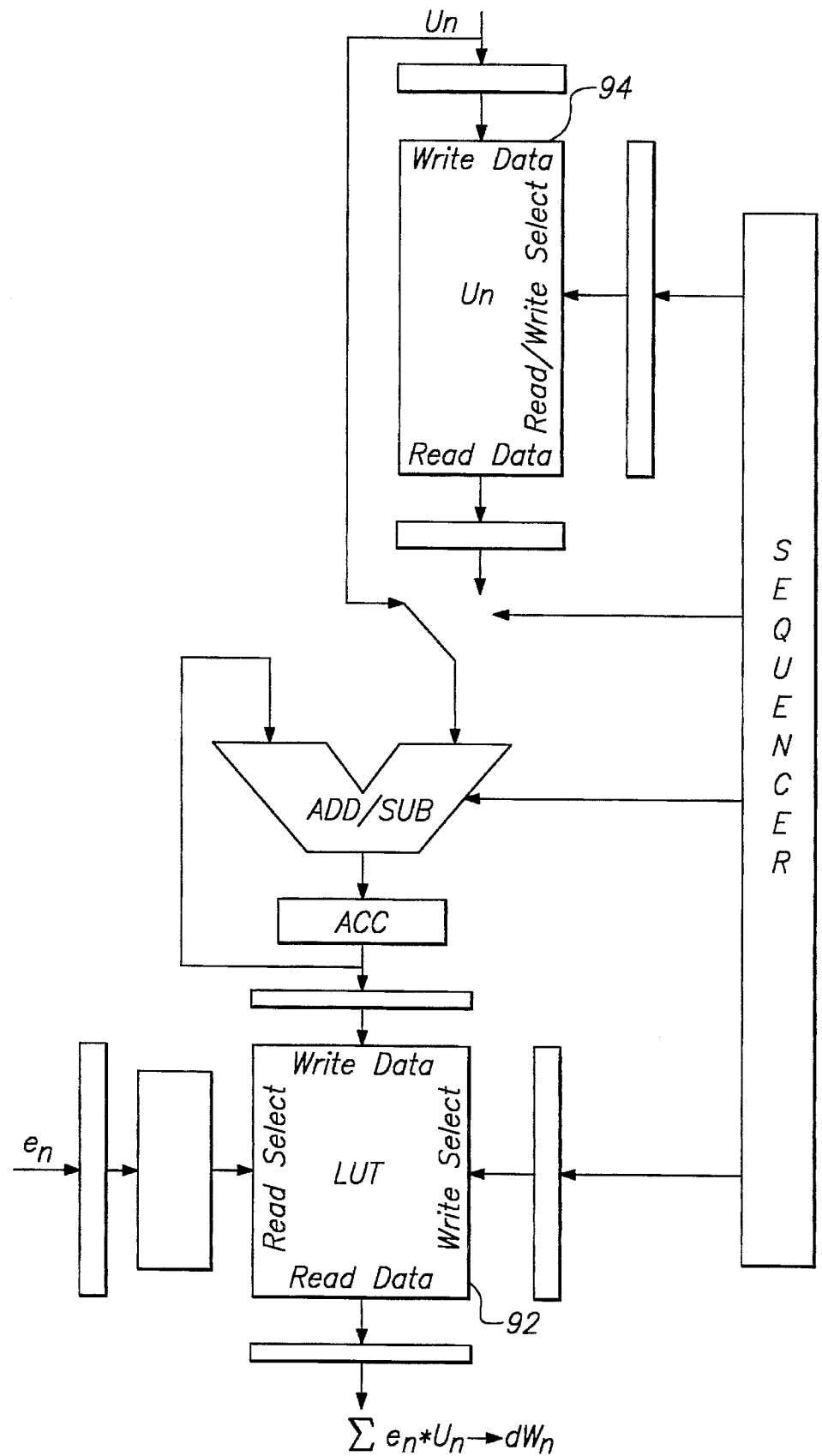
FIG. 22 is a block diagram of a programmable FIR filter constructed according the present invention which implements the error correction filter of FIG. 21.

FIG. 22 shows how to build the filter of FIG. 21 using the present invention. It operates exactly as the general filter of FIG. 3, but with different inputs. However, the LUT 92 is not the same as LUT 24 in FIG. 3 and does not contain the same information, but rather contains the products of the inputs $U_n$ and the estimated errors $e_n$ for the M consecutive points. Similarly, the coefficient memory 94 now contains the inputs $U_n$, rather than the coefficients $W_k$.

Figure 23:
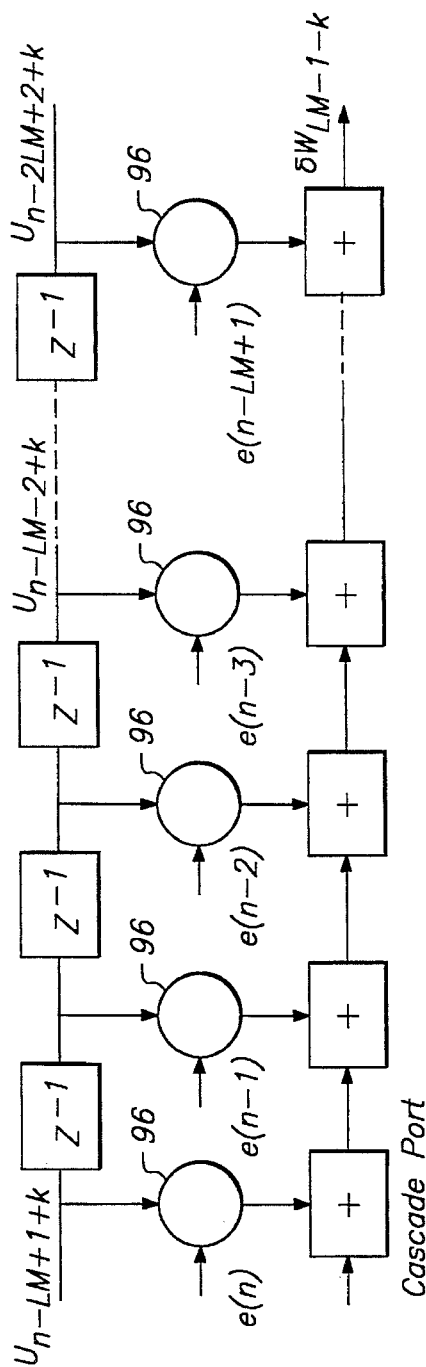
FIG. 23 shows an another transversal filter which implements the error correction circuit of FIG. 19.

Alternatively, this finite window approach may be implemented by a slightly different filter shown in FIG. 23. Here the inputs $U_n$ and estimated errors $e_n$ are reversed so that the inputs $U_n$ are the delayed inputs to the taps, while the estimated errors $e_n$ are now the coefficients. Again, these are multiplied by multipliers 96 and the outputs summed to obtain the correction vector. The mathematics of this are shown in Appendix E, and it can be seen that only the order of the variables is different. Again, this can be represented by a plurality L of filters each having M inputs as shown in FIG. 24.

Figure 24:
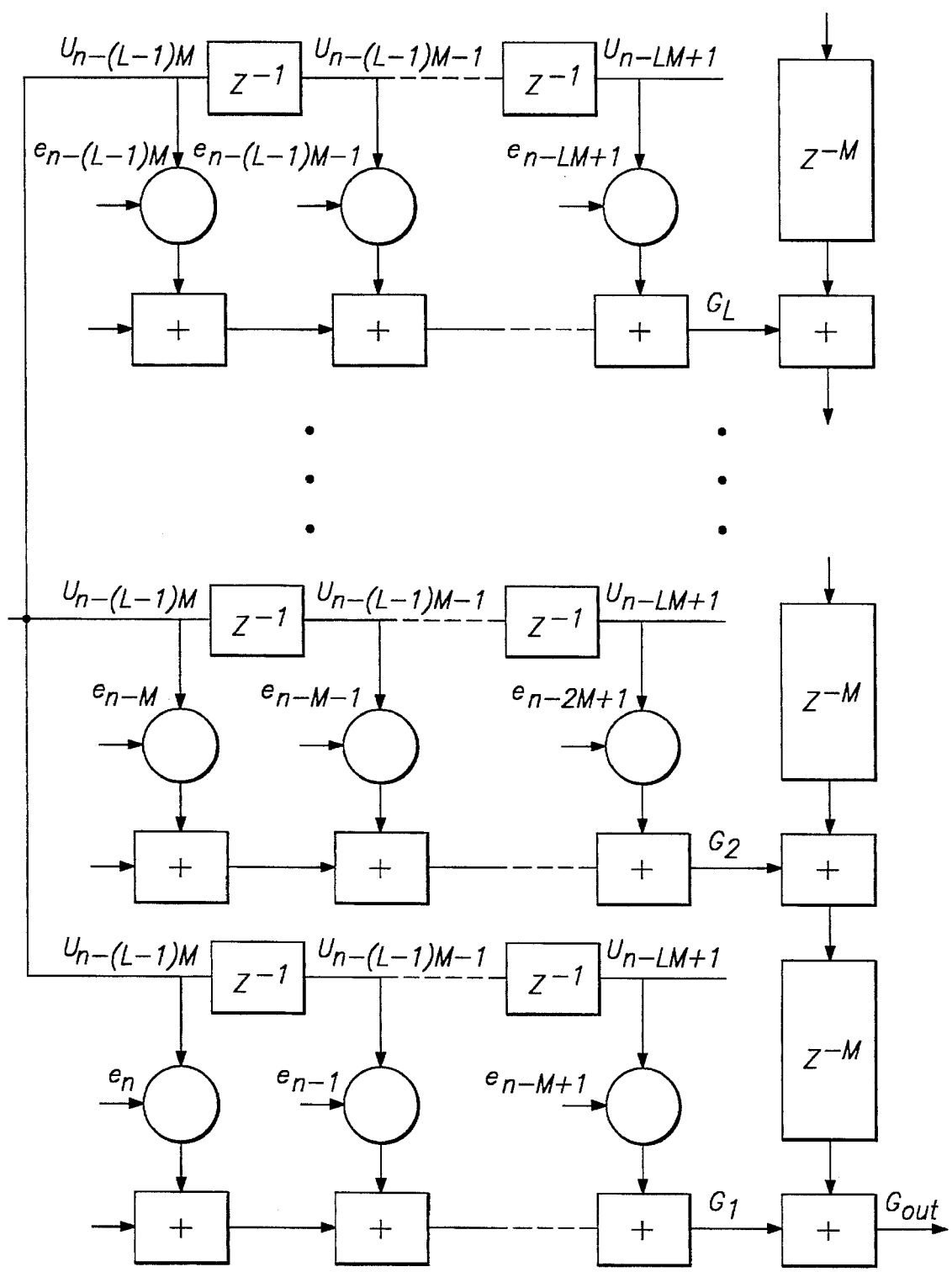
FIG. 24 is an alternative implementation of the error correction filter of FIG. 23.
Figure 25:
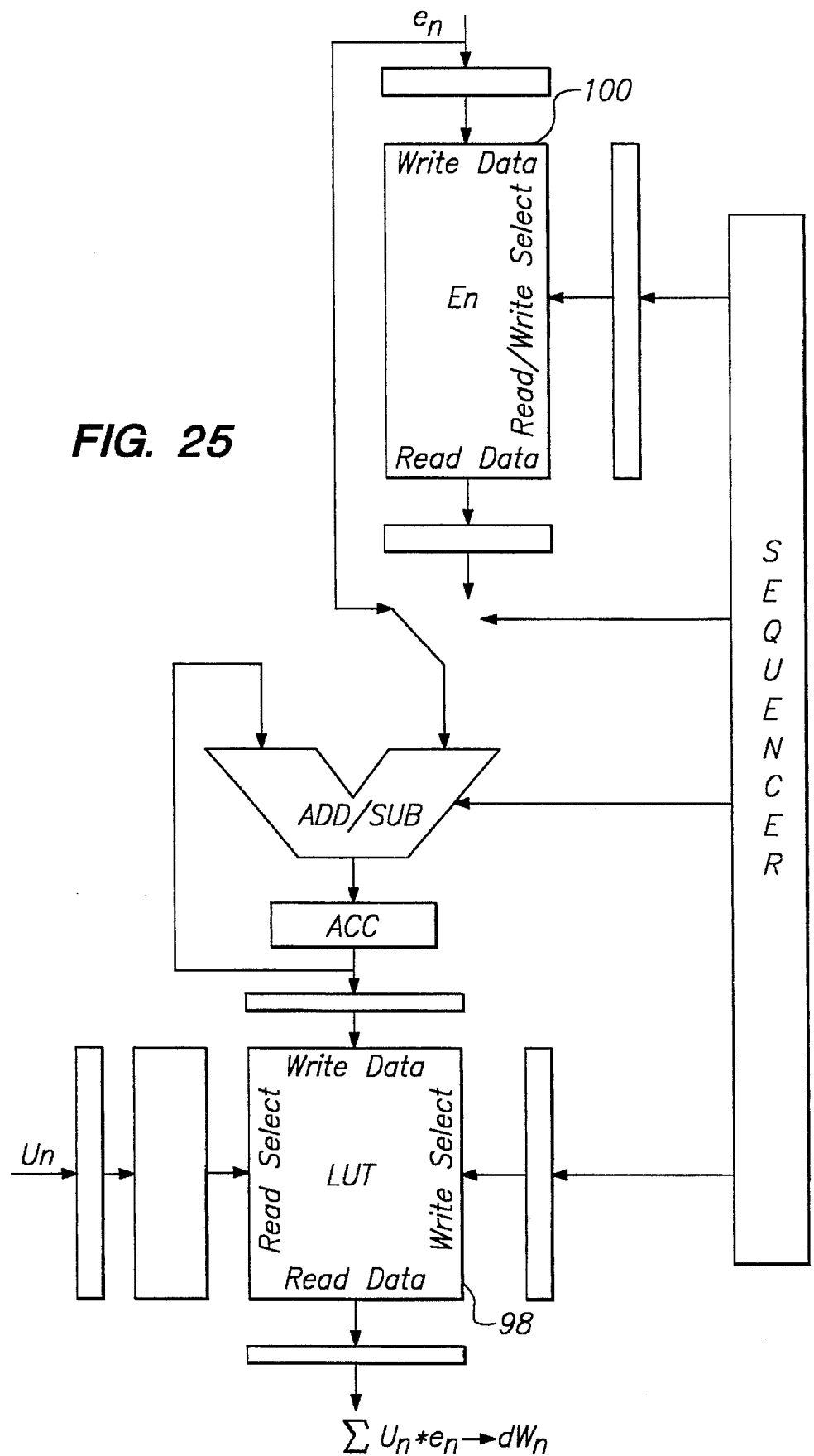
FIG. 25 is a block diagram of a programmable FIR filter constructed according the present invention which implements the error correction filter of FIG. 24.

FIG. 25 shows how to build the filter of FIG. 24 using the present invention. Again, it operates identically to the filters of FIGS. 3 and 21. However, the inputs are reversed from FIG. 21, the contents of the LUT 98 are not the same as those of LUT 24 in FIG. 3 (they are the same as those of LUT 92 in FIG. 21, and coefficient memory 100 now contains the estimated errors.

Figure 26:
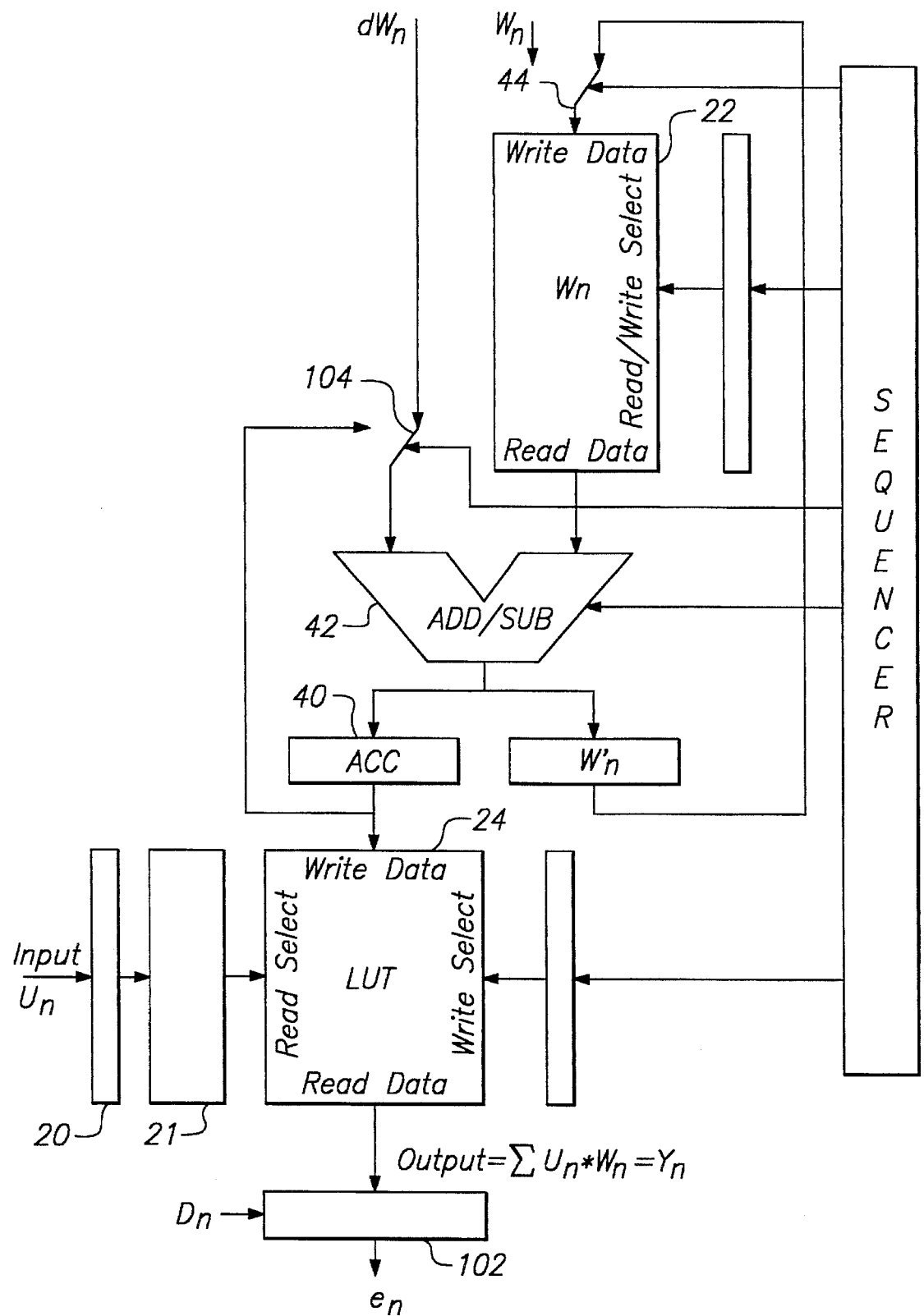
FIG. 26 is a block diagram of a programmable FIR filter constructed according to an eighth embodiment of the present invention which includes error correction.

FIG. 26 shows how the general filter of FIG. 3 and the error correction filter of either FIG. 22 or FIG. 25 may be combined. Numbers identical to those of FIG. 3 are used for comparable elements. The coefficients $W_n$ are loaded in coefficient memory 22 and LUT 24 loaded as described above. Switch 44 is initially in the position to receive the initial coefficient vector $W_n$. The output $Y_n$ is obtained and compared to a desired output $D_n$ in comparator 102 to find the estimated error $e_n$. This estimated error e is then used as an input to the filter of FIG. 21 or 23 to obtain a coefficient correction vector $\Delta W_n$.

Switch 104 is initially in the position shown to receive the coefficient correction vector $\Delta W_n$, and the sequencer instructs adder 42 to add the coefficient correction vector $\Delta W_n$ to the original coefficient vector $W_n$ to create new coefficient vector $W_n'$. Switch 44 is moved to the position shown to allow the new coefficient vector $W_n'$ to be loaded in coefficient memory 22, replacing the original coefficient vector $W_n$. This process is repeated until the minimum error is obtained, at which time switch 104 moves to the other position and the filter then operates normally without further error correction.

Figure 27:
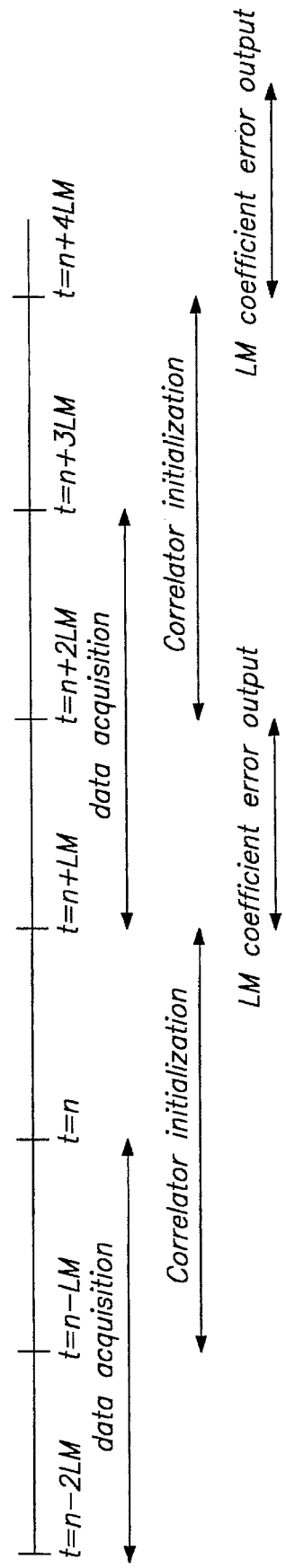
FIG. 27 is a timing diagram of the filter of FIG. 26 in operation.

In operation, once the filter of FIG. 26 is started, since LM input points are needed before the filter can generate the first output, it takes LM cycles to generate a set of LM outputs, and thus LM errors, before the system can begin to initialize the error correction filter or correlator, using the first error as a tap coefficient or input as above. It takes another LM cycles for the filter to generate a full set of outputs, and thus a full set of errors. Thus, line 1 of FIG. 27 shows a period of 2 LM for data acquisition.

Similarly, it takes LM cycles to get the LM errors needed to generate the first tap coefficient change. As shown on FIG. 23, the output of the error correction filter from this condition is $\Delta W_{LM-1}$. Next the input shifts one bit to the right, and a new bit is added to the front of the string, and the output of the correction filter is $\Delta W_{LM-2}$, and the process continues over LM cycles until an entire set of tap coefficient changes $\Delta W_n$ is generated. Thus, since LM cycles are needed to initialize the correction filter, and another LM cycles needed to generate the tap coefficient changes, it can be seen that 2 LM cycles are needed before the filter can be updated. This is shown on line 2 of FIG. 27.

Once all of the tap coefficient changes have been calculated, the filter can be updated and the process repeated until no further significant changes occur. Note that FIG. 27 shows the fastest operation of the error correction scheme possible. In appropriate circumstances, it may be desirable to slow the error correction down by allowing some time to pass between obtaining the tap coefficient changes and using them to update the filter to obtain new data.

From the above description, it will be apparent that the invention disclosed herein provides a novel and advantageous apparatus and method for filtering digital signals using programmable transversal filters comprised of memory, adders and multiplexers rather than multipliers. This type of filter allows maximum dynamic range, and may have any arbitrary precision and still operate at high speeds. The unique loading and refresh apparatus and method allows many of the inherent limitations of dynamic random access memory (DRAM) to be overcome and economizes the storage size and power consumption requirements of the DRAM, even where higher order filters are utilized. As above, a single DRAM may have multiple fields per location, again conserving size and power. The described adaptive filtering improves filter response and minimizes the error between the actual output and the desired output. The filter can also provide saturated outputs to prevent overflow or underflow due to coefficient normalization during adaptive filtering.

The foregoing discussion discloses and describes merely exemplary methods and embodiments of the present invention. As will be understood by those familiar with the art, the invention may be embodied in other specific forms without departing from the spirit or essential characteristics thereof. For example, different configurations of look-up tables may be used, or adders and delay units may be of different configurations or placed in different orders and still be within the present invention. The sequencing of various steps, such as initilization and adaptation of the coefficients, is somewhat flexible and may be altered. Accordingly, the disclosure of the present invention is intended to be illustrative, but not limiting, of the scope of the invention, which is set forth in the following claims.

APPENDIX A $$Addr_{i,n} = \sum_{i=0}^{M-2} a_{i,n-k} \cdot 2^k \qquad \text{EQ.3.2}$$

$$a_{i,n-k} = (1 + u_{i,n-k})/2 \qquad \text{EQ.3.3}$$

$$u_{i,n-k} = \{-1,1\} \Leftrightarrow a_{i,n-k} = \{0,1\} \qquad \text{EQ.3.4}$$

$$S_{i,n} = \left( \sum_{k=0}^{M-1} u_{i,n-k} \cdot W_k = \left[ \sum_{k=0}^{M-2} u_{i,n-k} \cdot W_k \right] + u_{i,n-(M-1)} \cdot W_{M-1} \right) \qquad \text{EQ.3.5}$$

$$S_{i,n} = \left\{ (-u_{i,n-(M-1)}) \left[ \sum_{k=0}^{M-2} u_{i,n-k} \cdot W_k \right] - W_{M-1} \right\} \cdot (-u_{i,n-(M-1)}) \qquad \text{EQ.3.6}$$

$$S_{i,n} = \left\{ \left[ \sum_{k=0}^{M-2} (-u_{i,n-(M-1)} \cdot u_{i,n-k}) \cdot W_k \right] - W_{M-1} \right\} \cdot (-u_{i,n-(M-1)}) \qquad \text{EQ.3.7}$$

$$S_{i,n} = \left\{ \left[ \sum_{k=0}^{M-2} u'_{i,n-k} \cdot W_k \right] - W_{M-1} \right\} \cdot (-u_{i,n-(M-1)}) \qquad \text{EQ.3.8}$$

$$(u'_{i,n-k} = -u_{i,n-k} \cdot u_{i,n-(M-1)} \Leftrightarrow a'_{i,n-k} = a_{i,n-k} \oplus a_{i,n-(M-1)}) \qquad \text{EQ.3.9}$$

$$S_{i,n} = S'_{i,n} \oplus a_{i,n-(M-1)} \qquad \text{EQ.3.10}$$

$$S'_{i,n} = \left[ \left( \sum_{k=0}^{M-2} u'_{i,n-k} \cdot W_k \right) - W_{M-1} \right] = Cont(Addr'_{i,n}) \qquad \text{EQ.3.11}$$

$$Addr'_{i,n} = \sum_{i=0}^{M-2} a'_{i,n-k} \cdot 2^k = \sum_{i=0}^{M-2} (a_{i,n-k} \oplus a_{i,n-(M-1)}) \cdot 2^k$$

APPENDIX B $$ACC_{i,0} = S_{i,0} + 2^p \times (Y_{i+1})$$

$$ACC_{i,j}|_{j=1}^{p} = S_{i,j} + 2^{-1} \times ACC_{j-1}$$

$$ACC_{i,p} = Y_i + Y_{i+1}$$

$$Y_i = \sum_{j=0}^{p} 2^{j-p} \times S_{i,j}$$

APPENDIX C $$H_{i,n} = H_{i,n-LM} + \mu \cdot \sum_{k=0}^{LM-1} E_{n-(LM-1-k)+i} \cdot U_{n-(LM-1-k)} \qquad \text{EQ.8.1}$$

$Y_n$ - Filter Output.
$U_n$ - Filter Input.
$H_k$ - Filter Coefficients.
$E_n$ - Output Error

APPENDIX D $$\delta W_i(N) = \mu \cdot e(N + i) \cdot U(N) \qquad \text{EQ.8.2}$$

$$\delta W_i(N - 1) = \mu \cdot e(N + i - 1) \cdot U(N - 1)$$

$$\vdots$$

$$\delta W_i(N - LM + 1) = \mu \cdot e(N + i - LM + 1) \cdot U(N - LM + 1)$$

-continued $$\sum_{n=N-LM+1}^{N} \delta W_i(n) = \mu \sum_{k=0}^{LM-1} e(N+i-k) \cdot U(N-k)$$

$$\overline{\delta W_i}(N) = \mu \sum_{k=0}^{LM-1} e(N+i-k) \cdot U(N-k)$$

APPENDIX E $$\delta W_i(N) = \mu \cdot e(N) \cdot U(N-i) \qquad \text{EQ.8.3}$$

$$\delta W_i(N-1) = \mu \cdot e(N-1) \cdot U(N-i-1)$$

$$\vdots$$

$$\delta W_i(N-LM+1) = \mu \cdot e(N-LM+1) \cdot U(N-LM+1-i)$$

$$\sum_{n=N-LM+1}^{N} \delta W_i(n) = \mu \sum_{k=0}^{LM-1} e(N-k) \cdot U(N-k-i)$$

$$\overline{\delta W_i}(N) = \mu \sum_{k=0}^{LM-1} e(N-k) \cdot U(N-k-i)$$

What is claimed is:

1. A method for loading data into a memory to be used as a look-up-table in a finite impulse response filter, said method comprising the steps of:

(a) storing a set of weighting coefficients into a coefficient register;

(b) generating an initial input vector having a plurality of bites, each bit corresponding to one of the weighting coefficients in said coefficient register;

(c) generating an initial table value to associate with said initial input vector, said initial table value representing the negative of the sum of the weighting coefficients;

(d) storing said initial table value into a memory location associated with said initial input vector, and into a temporary register;

(e) generating a new input vector having a plurality of bits, each bit corresponding to one of the weighting coefficients in said coefficient register, the new input vector differing from the input vector just previously generated in just one bit, said bit being referred to as the changed bit;

(f) determining whether the changed bit changed from a 1 to a 0, or from a 0 to a 1;

(g) in response to a determination that the changed bit changed from a 1 to a 0:
   1. selecting the coefficient corresponding to the changed bit from the coefficient register; and
   2. subtracting twice the corresponding coefficient from the table value currently stored in the temporary register to derive a new table value;

(h) in response to a determination that the changed bit changed from a 0 to a 1:
   1. selecting the coefficient corresponding to the changed bit from the coefficient register; and
   2. adding twice the corresponding coefficient to the table value currently stored in the temporary register to derive a new table value;

(i) storing said new table value into a memory location associated with the new input vector, and into said temporary register; and (j) repeating steps (e) through (i) until a selected number of table values have been loaded into the memory.

2. The method of claim 1, wherein step (e) comprises the step of:
generating said new input vector using gray coding.

3. The method of claim 2, wherein step (i) comprises the steps of:

converting said new input vector from a gray code to a binary code; and storing said new table value into a memory location indicated by said binary code.

4. A finite impulse response filter, comprising:

a coefficient register for storing a set of weighting coefficients;

an input vector generator for generating a plurality of input vectors, each input vector having a plurality of bits, each bit corresponding to one of the weighting coefficients in said coefficient register, said generator generating an initial input vector and a plurality of successive input vectors with each successive input vector differing from an immediately prior input vector by only one bit, this one bit in each input vector being referred to as the changed bit;

means for deriving an initial table value to associate with said initial input vector, said initial table value representing the negative of the sum of the weighting coefficients;

a temporary register for storing a most recently derived table value;

means for generating, for each of said successive input vectors, a table value associated with the input vector, said generating means determining for each successive input vector whether the changed bit changed from a 1 to a 0, or from a 0 to a 1, and in response to a determination that the changed bit changed from a 1 to a 0, said generating means selecting the coefficient corresponding to the changed bit from the coefficient register and subtracting twice the corresponding coefficient from the table value currently stored in said temporary register to derive a table value for the input vector, and in response to a determination that the changed bit changed from a 0 to a 1, said generating means selecting the coefficient corresponding to the changed bit from the coefficient register and adding twice the corresponding coefficient to the table value currently stored in said temporary register to derive a table value for the input vector;

means for storing each table value into said temporary register after each table value is generated;

a memory;

means for storing said table values into said memory, with each table value being stored in a memory location associated with the input vector corresponding to the table value; and means for receiving an actual input vector and accessing a memory location in said memory associated with said actual input vector to cause said memory to output the table value associated with said actual input vector, the outputted table value representing a filtered output for the actual input vector.

5. The finite impulse response filter of claim 4, wherein said input vector generator is a gray counter for generating a gray code sequence.

6. The finite impulse response filter of claim 5, wherein said means for storing said table values into said memory comprises:

means for converting said input vector from a gray code to a binary code; and means for storing the table value corresponding to said input vector into a memory location indicated by said binary code.

7. The finite impulse response filter of claim 6, wherein said means for receiving an actual vector comprises:

means for converting said actual input vector into an actual binary code; and means for accessing a memory location indicated by said actual binary code to cause said memory to output the table value stored therein.

8. A method for adaptively filtering digital input samples, comprising the steps of:

storing a set of weighting coefficients in a coefficient register:

generating a plurality of possible sets of input samples and associated table values, each table value representing a sum of the products of the associated input samples and said weighting coefficients;

storing said table values into a memory to be used as a look-up table;

applying input samples to the memory to cause the memory to output selected table values, these selected table values representing filtered outputs of the applied input samples;

comparing the filtered outputs from the memory with a set of desired outputs to derive an error vector;

generating a set of coefficient adjustments based on said error vector:

combining said set of coefficient adjustments with said weighting coefficients to derive a set of revised weighting coefficients;

storing said revised weighting coefficients into the coefficient register;

generating another plurality of possible sets of input samples and associated revised table values, each revised table value representing a sum of the products of the associated input samples and said revised weighting coefficients;

storing said revised table values into the memory; and applying input samples to the memory to cause the memory to output selected revised table values, these revised table values representing the revised filtered outputs of the applied input samples.

9. An adaptive digital filter, comprising:

a coefficient register for storing a set of weighting coefficients;

means for generating a plurality of possible sets of input samples and associated table values, each table value representing a sum of the products of the associated input samples and said weighting coefficients;

a memory for use as a look-up table;

means for storing said table values into said memory;

means for applying input samples to said memory to cause said memory to output selected table values, these selected table values representing filtered outputs of the applied input samples;

means for comparing said filtered outputs from said memory with a set of desired outputs to derive an error vector;

means for generating a set of coefficient adjustments based on said error vector;

means for combining said set of coefficient adjustments with said weighting coefficients to derive a set of revised weighting coefficients;

means for storing said revised weighting coefficients into said coefficient register;

means for generating another plurality of possible sets of input samples and associated revised table values, each revised table value representing a sum of the products of the associated input samples and said revised weighting coefficients;

means for storing said revised table values into said memory; and means for applying input samples to said memory to cause said memory to output selected revised table values, these revised table values representing revised filtered outputs of the applied input samples.

10. In an adaptive digital filter wherein an input digital stream is filtered using a set of weighting coefficients to derive a filtered output, an apparatus for correlating said input digital stream with an error vector derived from said filtered output, comprising:

a coefficient register for storing said error vector;

means for generating a plurality of possible sets of input samples and associated table values, each table value representing a sum of the products of the associated input samples and said error vector;

a memory for use as a look-up table;

means for storing said table values into said memory;

means for applying said input digital stream to said memory to cause said memory to output selected table values, these selected table values representing coefficient adjustments for adjusting said weighting coefficients.

11. In an adaptive digital filter wherein an input digital stream is filtered using a set of weighting coefficients to derive a filtered output, an apparatus for correlating said input digital stream with an error vector derived from said filtered output, comprising:

a coefficient register for storing said input digital stream;

means for generating a plurality of possible sets of input samples and associated table values, each table value representing a sum of the products of the associated input samples and said input digital stream;

a memory for use as a look-up table;

means for storing said table values into said memory;

means for applying said error vector as input to said memory to cause said memory to output selected table values, these selected table values representing coefficient adjustments for adjusting said weighting coefficients.

* * * * *